United States Patent
Yoon et al.

(10) Patent No.: US 7,883,972 B2
(45) Date of Patent: Feb. 8, 2011

(54) SEMICONDUCTOR DEVICE HAVING A FIN STRUCTURE AND METHOD OF MANUFACTURING THE SAME

(75) Inventors: Jae-Man Yoon, Seoul (KR); Choong-Ho Lee, Seongnam-si (KR); Chul Lee, Seoul (KR); Dong-Gun Park, Seongnam-si (KR)

(73) Assignee: Samsung Electronics Co., Ltd., Gyeonngi-do (KR)

( * ) Notice: Subject to any disclaimer, the term of this patent is extended or adjusted under 35 U.S.C. 154(b) by 9 days.

(21) Appl. No.: 12/219,984

(22) Filed: Jul. 31, 2008

(65) Prior Publication Data

US 2008/0293203 A1 Nov. 27, 2008

Related U.S. Application Data

(62) Division of application No. 11/183,995, filed on Jul. 19, 2005, now Pat. No. 7,420,244.

(30) Foreign Application Priority Data

Jul. 30, 2004 (KR) ................. 2004-60069

(51) Int. Cl.
*H01L 21/336* (2006.01)
(52) U.S. Cl. ............... 438/283; 257/E27.027; 257/E21.038; 257/E21.422; 438/717; 438/733; 438/736
(58) Field of Classification Search ........ 257/E21.023, 257/E21.442, E21.027, E21.038; 438/283, 438/717, 736, 733
See application file for complete search history.

(56) References Cited

U.S. PATENT DOCUMENTS

| 6,252,284 | B1 | 6/2001 | Muller et al. | |
|---|---|---|---|---|
| 6,642,090 | B1 | 11/2003 | Fried et al. | |
| 6,720,619 | B1* | 4/2004 | Chen et al. | 257/347 |
| 7,279,375 | B2* | 10/2007 | Radosavljevic et al. | 438/197 |
| 7,393,733 | B2* | 7/2008 | Currie | 438/164 |
| 2004/0256647 | A1 | 12/2004 | Lee et al. | |
| 2005/0104096 | A1 | 5/2005 | Lee et al. | |
| 2005/0145932 | A1* | 7/2005 | Park et al. | 257/328 |
| 2005/0250285 | A1* | 11/2005 | Yoon et al. | 438/283 |
| 2006/0113603 | A1* | 6/2006 | Currie | 257/368 |
| 2007/0114612 | A1* | 5/2007 | Ahn et al. | 257/364 |

FOREIGN PATENT DOCUMENTS

| JP | 08-139325 | 5/1996 |
|---|---|---|
| KR | 10-2003-0020644 A | 3/2003 |

* cited by examiner

*Primary Examiner*—Anh Phung
*Assistant Examiner*—Michael Lulis
(74) *Attorney, Agent, or Firm*—Harness, Dickey & Pierce, PLC

(57) ABSTRACT

A semiconductor device may include a fin structure having source/drain regions and channel fins connected between source/drain patterns. A gate insulation layer may be provided on the channel fins. A gate electrode may include lower gate patterns and an upper gate pattern. The lower gate patterns may extend in a vertical direction and contact the gate insulation layer. The upper gate pattern may extend in a second horizontal direction substantially perpendicular to the first horizontal direction. The upper gate pattern may be connected to upper portions of the lower gate patterns.

10 Claims, 27 Drawing Sheets

SEMICONDUCTOR DEVICE HAVING A FIN STRUCTURE AND METHOD OF MANUFACTURING THE SAME

FOREIGN PRIORITY STATEMENT

This application claims priority under 35 U.S.C. §119 to Korean Patent Application No. 10-2004-0060069, filed on Jul. 30, 2004 with the Korean Intellectual Property Office (KIPO), the entire contents of which are incorporated herein by reference.

DOMESTIC PRIORITY STATEMENT

This application also claims priority under 35 U.S.C. §120 as a divisional of U.S. application Ser. No. 11/183,995, filed on Jul. 19, 2005 now U.S. Pat. No. 7,420,244 with the United States Patent & Trademark Office (USPTO), the entire contents of which are incorporated herein by reference.

BACKGROUND

1. Technical Field

Example, non-limiting embodiments of the present invention relate generally to a semiconductor device such as a field effect transistor (for example) and a method of manufacturing the semiconductor device. More particularly, example, non-limiting embodiments of the present invention relate to a fin field effect transistor (FinFET) that may have a fin structure and a method of manufacturing the fin field effect transistor.

2. Description of the Related Art

A semiconductor device may be highly integrated so that an area of an active region may be reduced. Accordingly, a channel length of a metal oxide semiconductor transistor (MOS), for example, formed on the active region may also be reduced. When the channel length of the MOS transistor is reduced, source/drain regions may have an influence on an electric field and/or a voltage in a channel region. This phenomenon may be referred to as a short channel effect. In addition, a channel width may be reduced proportionally to the reduction of the active region so that a threshold voltage may be increased. This phenomenon may be referred to as a narrow channel effect or a narrow width effect. Further, a carrier mobility of the transistor may be decreased so that a current drivability may also decrease. The decrease of the current drivability may deteriorate an operational capacity of the transistor.

Reducing the above-described problems has been the subject of development. According to such development, a semiconductor device such as a FinFET may have a fin structure formed on a semiconductor substrate. Conventional methods are known for forming a FinFET on a bulky semiconductor substrate. In addition, conventional structures may implement a planarized silicon fin device.

Notwithstanding conventional developments, it may be desirable to provide a semiconductor device capable of reducing the above-described problems, which may arise due to a scaling-down, for example.

SUMMARY

According to an example, non-limiting embodiment of the present invention, a semiconductor device may include a fin structure that may protrude from a substrate and may extend in a first horizontal direction. The fin structure may include source/drain patterns and channel fins may be connected between the source/drain patterns. A gate insulation layer may be provided on the channel fins. Lower gate patterns may contact the gate insulation layer and may extend in a vertical direction. An upper gate pattern may extend in a second horizontal direction, which may be perpendicular to the first horizontal direction. The upper gate pattern may be connected to upper portions of the lower gate patterns.

According to another example, non-limiting embodiment of the present invention, a method of manufacturing a semiconductor device may involve forming a fin structure that may protrude from a substrate and may extend in a first horizontal direction. The fin structure may include source/drain patterns and channel fins may be connected between the source/drain patterns. A gate insulation layer may be formed on the channel fins. Lower gate patterns may be formed to contact the gate insulation layer. The lower gate patterns may extend in a vertical direction. An upper gate pattern may be formed and may extend in a second horizontal direction, which may be substantially perpendicular to the first horizontal direction. The upper gate pattern may be connected to upper portions of the lower gate patterns.

According to another example, non-limiting embodiment of the present invention, a semiconductor device may include a fin structure that may protrude from a substrate and may extend in a first horizontal direction. The fin structure may include source/drain patterns and a channel fin may be connected between the source/drain patterns. A gate insulation layer may be provided on the channel fin. Lower gate patterns may be provided on opposite sidewalls of the channel fin. The lower gate patterns may extend in a vertical direction. An upper gate pattern may extend in a second horizontal direction and across the lower gate patterns. The upper gate pattern may be connected to upper portions of the lower gate patterns.

According to another example, non-limiting embodiment of the present invention, a method may involve forming a fin structure on a substrate. The fin structure may protrude from the substrate and may extend in a first horizontal direction. The fin structure may include source/drain patterns and a channel fin may be connected between the source/drain patterns. A gate insulation layer may be formed on the channel fin. Lower gate patterns may be formed on opposite sidewalls of the channel fin. The lower gate patterns may extend in a vertical direction. An upper gate pattern may be formed and may extend in a second horizontal direction and across the lower gate patterns. The upper gate pattern may be connected to upper portions of the lower gate patterns.

BRIEF DESCRIPTION OF THE DRAWINGS

Example, non-limiting embodiments of the present invention will become readily apparent by reference to the following detailed description when considered in conjunction with the accompanying drawings, wherein like reference numerals designate like structural elements.

DESCRIPTION OF EXAMPLE EMBODIMENTS

Figure 1:
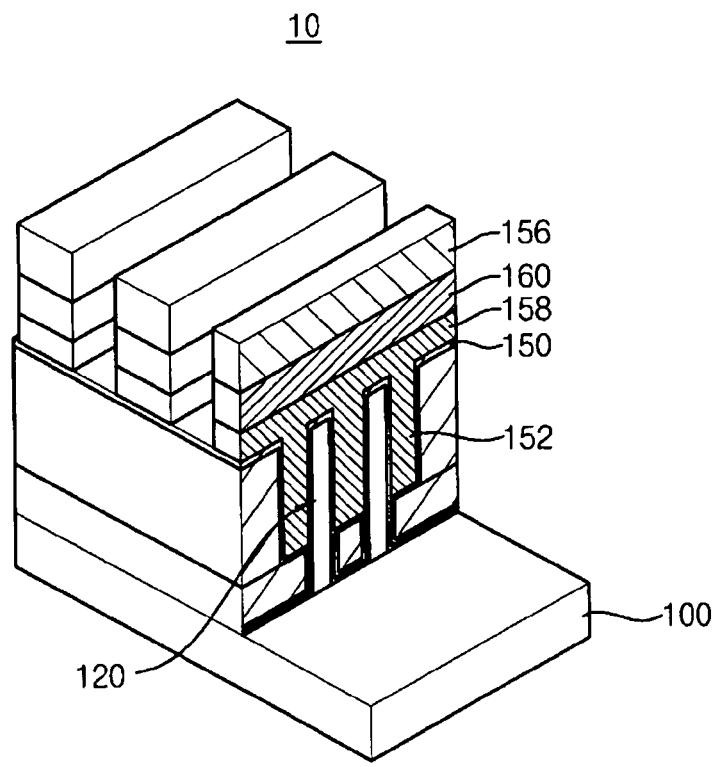
FIG. 1 is a perspective view of a semiconductor device in accordance with an example, non-limiting embodiment of the present invention.

Example, non-limiting embodiments of the present invention will be described with reference to the accompanying drawings, in which embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention. In the drawings, the size and relative sizes of layers and regions may be exaggerated for clarity. The drawings are not to scale.

It will be understood that when an element or layer is referred to as being "on", "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, there may be no intervening elements or layers present. As used herein, the term "and/or" may include any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of example, non-limiting embodiments of the present invention.

Spatially relative terms, such as "beneath," "below," "lower," "above," "upper" and the like, may be used to describe an element and/or feature's relationship to another element(s) and/or feature(s) as illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized and/or overly formal sense unless expressly so defined herein.

Figure 2:
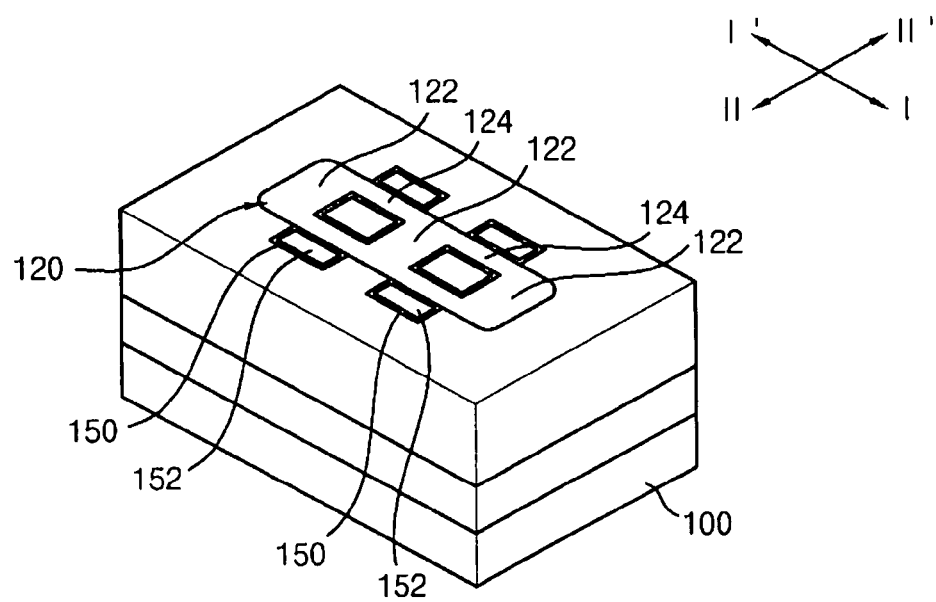
FIG. 2 is a cross-sectional view of the semiconductor device shown in FIG. 1.

FIG. 1 is a perspective view illustrating a semiconductor device in accordance with an example, non-limiting embodiment of the present invention, and FIG. 2 is a cross-sectional view illustrating the semiconductor device shown in FIG. 1.

Referring to FIGS. 1 and 2, a semiconductor device 10 may include a fin structure 120. The fin structure 120 may protrude from a semiconductor substrate 100, such as a silicon wafer (for example). The fin structure 120 may extend in a first horizontal direction (direction I-I') along the semiconductor substrate 100.

The fin structure 120 may include source/drain patterns 122 and one or more channel fins 124. The source/drain patterns 122 may protrude from the semiconductor substrate 100. The source/drain patterns 122 may be spaced apart from each other in the first horizontal direction (direction I-I'). The channel fins 124 may be connected between the source/drain patterns 122. The channel fins 124 may protrude from the semiconductor substrate 100. The channel fins 124 may extend in the first horizontal direction (direction I-I'). By way of example only, the channel fins 124 may be parallel to each other. The upper faces of the channel fins 124 and the upper faces of the source/drain patterns 122 may be substantially located in a single plane.

As illustrated in FIG. 1, the fin structure 120 may protrude in a vertical direction from the semiconductor substrate 100. The semiconductor substrate 100 may be anisotropically etched (for example) using a mask pattern to form the fin structure 120.

A gate insulation layer 150 may be formed on sidewalls and upper faces of the channel fins 124. The gate insulation layer 150 may include a material having a high dielectric constant, silicon oxide and/or, silicon oxynitride, for example. These materials may be used alone or in combination. The materials having a high dielectric constant may include hafnium oxide ($HfO_2$), zirconium oxide ($ZrO_2$), lanthanum oxide ($La_2O_3$), tantalum pentoxide ($Ta_2O_5$), titanium oxide ($TiO_2$), strontium titanate ($SrTiO_3$) and/or barium strontium titanate (($Ba,Sr)TiO_3$), for example. These materials may be used alone or in combination.

The semiconductor device 100 may include lower gate patterns 152 and an upper gate pattern 158. The lower gate patterns 152 may contact the gate insulation layer 150. The upper gate pattern 158 may be connected to the lower gate pattern 152. The lower gate patterns 152 may vertically extend from the upper gate pattern 158. The upper gate pattern 158 may be formed on upper faces of the gate insulation layer 150. The upper gate pattern 158 may extend in a second horizontal direction (direction II-II'). The upper gate pattern 158 may be connected to upper portions of the lower gate patterns 152. That is, the lower gate patterns 152 extend in the vertical direction toward the semiconductor substrate 100 from the upper gate pattern 158, which may extend in the second horizontal direction (direction II-II'). As shown in FIG. 1, the first horizontal direction (direction I-I') may be perpendicular to the second horizontal direction (direction II-II').

The lower gate patterns 152 may have extension lengths in the vertical direction that may be substantially identical to each other. The channel fins 124 may have extension lengths in the first horizontal direction (direction I-I') that may be substantially identical to each other. The upper gate pattern 158 and the lower gate patterns 152 may have widths in the first horizontal direction (direction I-I') that may be substantially identical to each other. The widths of the lower gate patterns 152 (in the first horizontal direction) may be substantially identical to the extension lengths of the channel fins 124 (in the first horizontal direction).

The upper and the lower gate patterns 158 and 152 may include polysilicon doped with impurities, for example. The impurities may include arsenic (As), phosphorus (P) and/or boron (B), for example. These impurities may be used alone or in combination.

The semiconductor device 10 may include a metal silicide pattern 160 and a capping pattern 156 formed on the upper gate pattern 158. The metal silicide pattern 160 may include tungsten silicide ($WSi_x$), titanium silicide ($TiSi_x$), cobalt silicide ($CoSi_x$), tantalum silicide ($TaSi_x$), for example. These materials may be used alone or in combination. The capping layer 156 may include silicon nitride, for example.

FIGS. 3 to 46 are schematic views of an example method that may be implemented to manufacture the semiconductor device shown in FIGS. 1 and 2.

Figure 3:
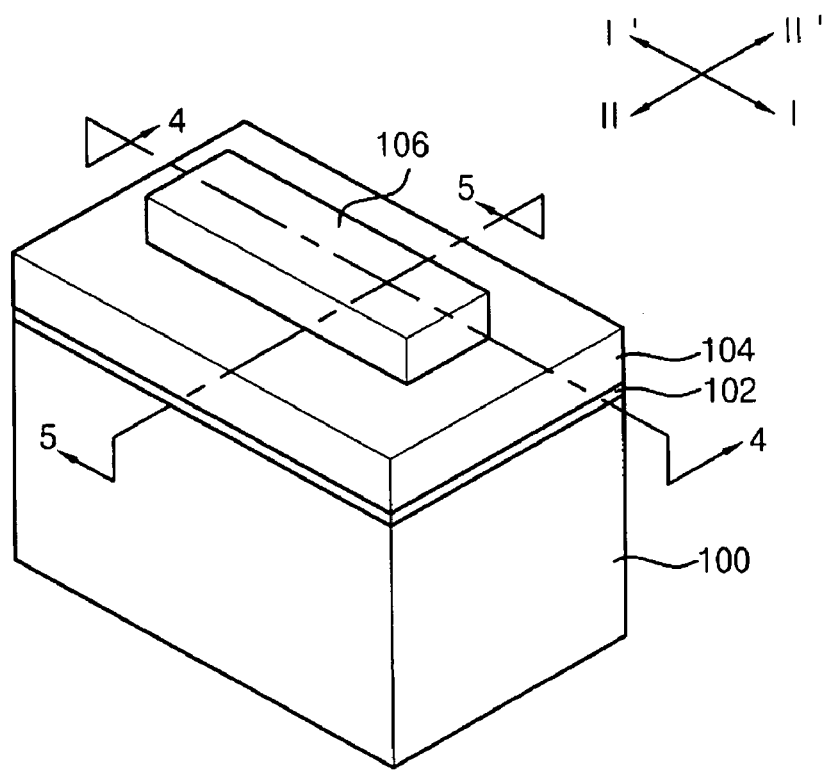
FIGS. 3 to 46 are schematic views of an example method that may be implemented to manufacture the semiconductor device shown in FIGS. 1 and 2.
Figure 4:
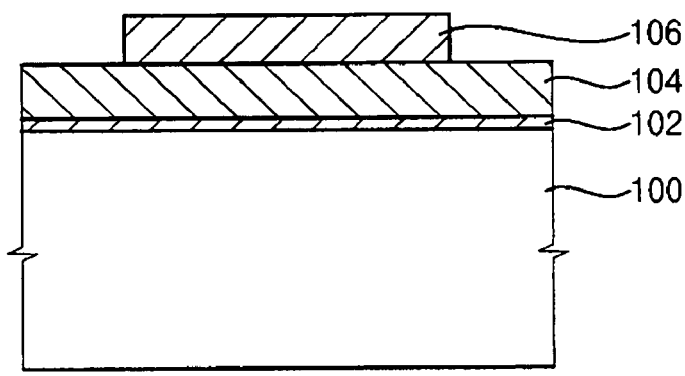
Figure 5:
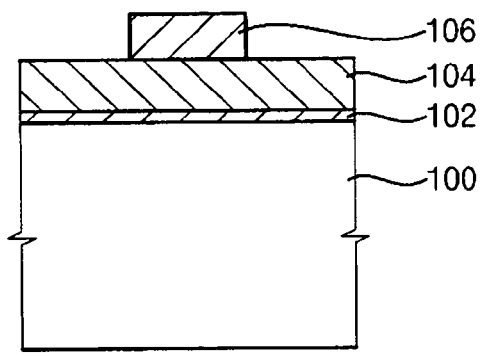

FIG. 3 is a perspective view of first and second mask patterns that may be formed on a substrate. FIG. 4 is a cross-sectional view taken along a line 4-4 shown in FIG. 3. FIG. 5 is a cross-sectional view taken along a line 5-5 shown in FIG. 3.

Referring to FIGS. 3 to 5, a pad oxide layer 102, which may have a thickness of from about 50 Å to about 150 Å (for example), may be formed on a semiconductor substrate 100, such as a silicon wafer, for example. The pad oxide layer 102 may be formed by a thermal oxidation process, for example. A first mask layer 104 may be formed on the pad oxide layer 102, and a second mask layer (not shown) may be formed on the first mask layer 104. The first mask layer 104 may include silicon nitride, for example. The first mask layer 104 may have a thickness of about 500 Å to about 1,000 Å, for example. The first mask layer 104 may be formed by a low pressure chemical vapor deposition (LPCVD) process and/or a plasma enhanced chemical vapor deposition (PECVD) process (for example) that may use a dichlorosilane ($SiH_2Cl_2$) gas, a silane ($SiH_4$) gas, and/or an ammonia ($NH_3$) gas, for example. The second mask layer may include silicon oxide, for example. The silicon oxide may include high density plasma (HDP) oxide, for example. The second mask layer may be formed by a PECVD process, for example. The second mask layer may have a thickness similar or identical to that of the first mask layer 104.

The second mask layer may be patterned to form a preliminary mask pattern 106. For example, a first photoresist pattern may be formed on the second mask layer. The second mask layer may be anisotropically etched (for example) using the first photoresist pattern as an etching mask to form the preliminary mask pattern 106. The first photoresist pattern may be formed by a photolithography process, for example. After forming the preliminary mask pattern 106, the first photoresist pattern may be removed by an ashing process and/or a stripping process, for example.

As illustrated in FIG. 3, the preliminary mask pattern 106 may have a rectangular parallelepiped shape (for example) extending in the first horizontal direction (direction I-I'). A second horizontal direction (direction II-II') may be substantially perpendicular to the first horizontal direction (direction I-I').

Figure 6:
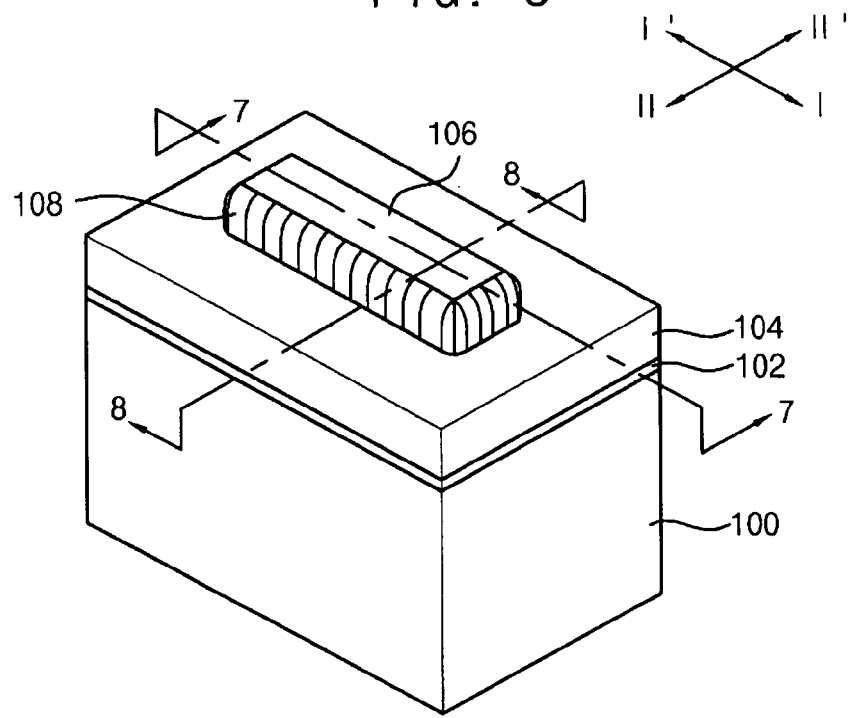
Figure 7:
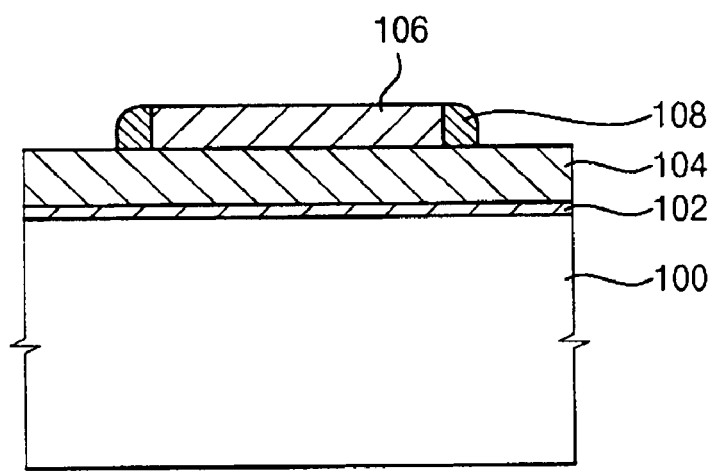
Figure 8:
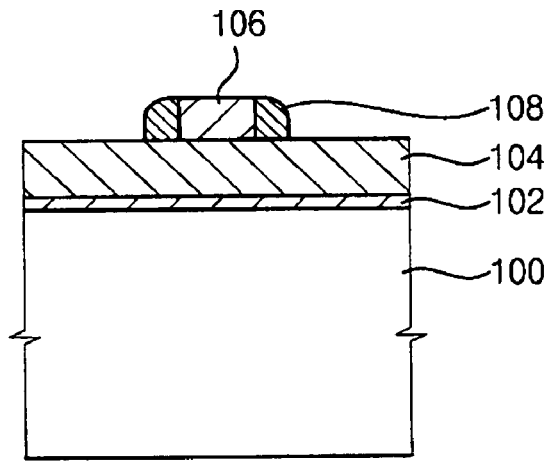

FIG. 6 is a perspective view of a polysilicon spacer that may be formed on a sidewall of the preliminary mask pattern 106. FIG. 7 is a cross-sectional view taken along the line 7-7 shown in FIG. 6. FIG. 8 is a cross-sectional view taken along the line 8-8 shown in FIG. 6.

Referring to FIGS. 6 to 8, a portion of the preliminary mask pattern 106 may be isotropically etched (for example) to a thickness of about 200 Å to about 300 Å, for example. A third mask layer (not shown) may be formed on the first mask layer 104 and the preliminary mask pattern 106. For example, the portion of the preliminary mask pattern 106 may be removed by a wet etching process (for example) that may use a diluted hydrofluoric acid solution, for example. The third mask layer may include polysilicon, for example. The third mask layer, which may have a thickness of about 200 Å to about 300 Å (for example), may be formed by a LPCVD process, for example.

The third mask layer may be partially removed by an etch-back process (for example) so that the preliminary mask pattern 106 may be exposed to form a polysilicon spacer 108 on a sidewall of the preliminary mask pattern 106. That is, the polysilicon spacer 108 may be a portion of the third mask layer that may remain on the first mask layer 104 after performing the etch-back process.

As noted above, the preliminary mask pattern 106 may be isotropically etched so that a size of the preliminary mask pattern 106 is adjusted. Alternatively, the size of the preliminary mask pattern 106 may be adjusted by controlling a size of the first photoresist pattern, in advance.

Figure 9:
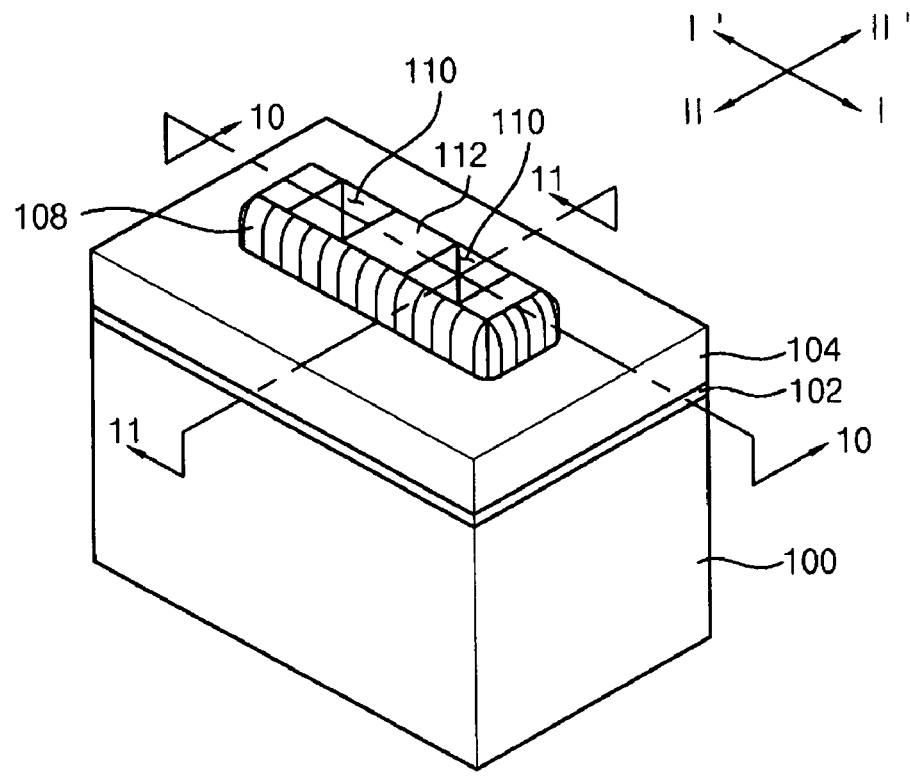
Figure 10:
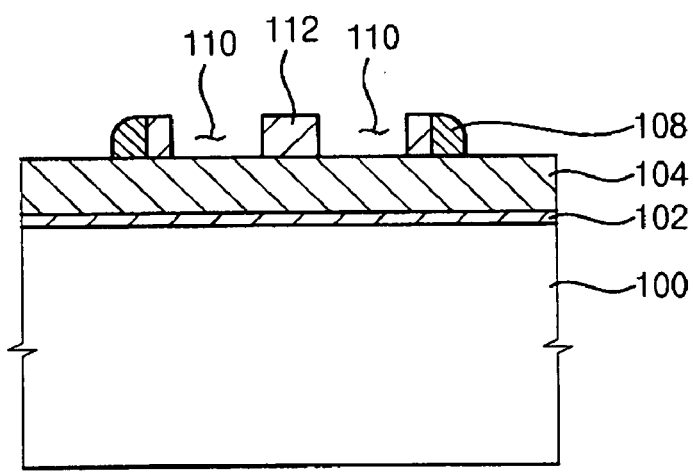
Figure 11:
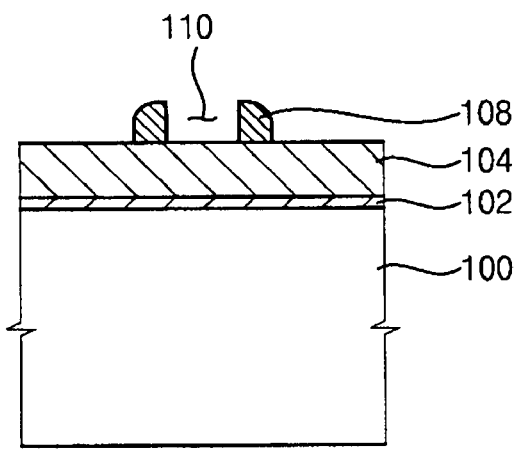

FIG. 9 is a perspective view of a first opening that may be formed through the preliminary mask pattern 106. FIG. 10 is a cross-sectional view taken along the line 10-10 shown in FIG. 9. FIG. 11 is a cross-sectional view taken along the line 11-11 shown in FIG. 9.

Referring to FIGS. 9 to 11, the preliminary mask pattern 106 may be partially etched to form a first opening 110. The first opening 110 may partially expose the first mask layer 104. For example, a second photoresist pattern (not shown), which may have a second opening that may partially expose the preliminary mask pattern 106, may be formed on the first mask layer 104, the polysilicon spacer 108, and the preliminary mask pattern 106. The preliminary mask pattern 106 may be anisotropically etched (for example) using the second photoresist pattern as an etching mask to form the first opening 110 and a second mask pattern 112. The second photoresist pattern may be formed by a photolithography process, for example. After forming the first opening 110 and the second mask pattern 112, the second photoresist pattern may be removed by an ashing process and/or a stripping process, for example.

The second opening of the second photoresist pattern may extend in the second horizontal direction (direction II-II'). Thus, the first opening 110 may be defined by the second mask pattern 112 and the polysilicon spacer 108. By way of example only, a cross section of the first opening 110 may have a quadrangle shape.

Figure 12:
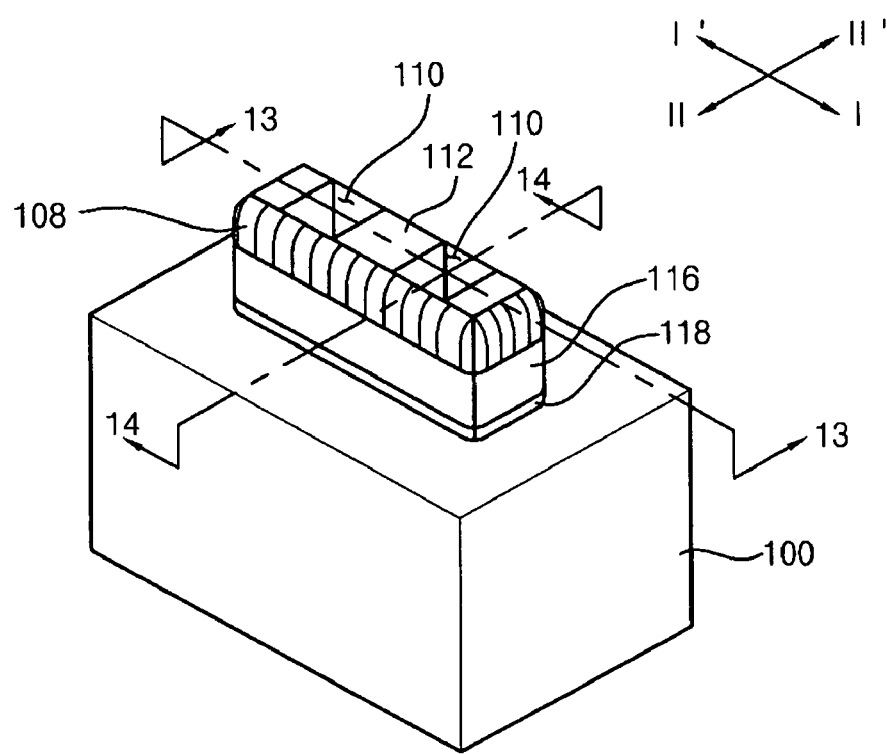
Figure 13:
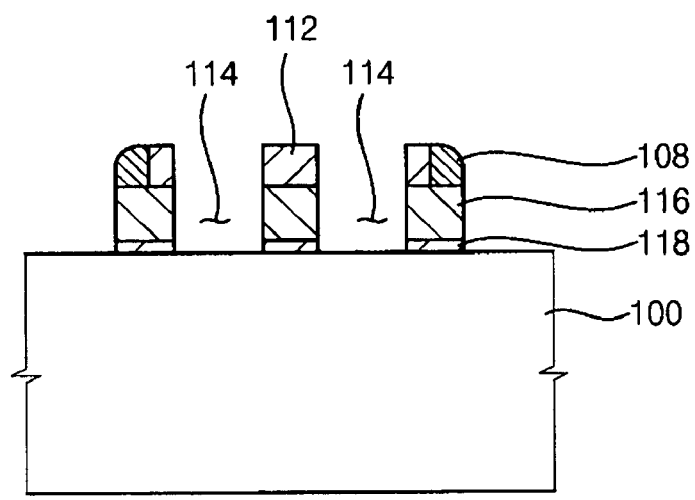
Figure 14:
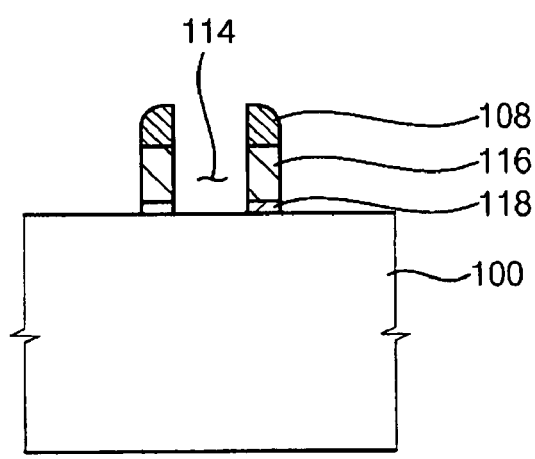

FIG. 12 is a perspective view of a third opening that may partially expose the semiconductor substrate therethrough. FIG. 13 is a cross-sectional view taken along the line 13-13 shown in FIG. 12. FIG. 14 is a cross-sectional view taken along the line 14-14 shown in FIG. 12.

Referring to FIGS. 12 to 14, the first mask layer 104 and the pad oxide layer 102 may be partially removed to form a third opening 114. The third opening 114 may partially expose the semiconductor substrate 100. For example, the first mask layer 104 and the pad oxide layer 102 may be removed by an anisotropic etching process (for example) using the polysilicon spacer 108 and the second mask pattern 112 as etching masks. Thus, a first mask pattern 116 and a pad oxide layer pattern 118 may define the third opening 114. Alternatively, the first mask layer 104 may be partially removed so that a portion of the pad oxide layer 102 may be exposed. The exposed portion of the pad oxide layer may be removed by a wet etching process (for example) to form the third opening 114.

As illustrated in FIG. 12, the first mask pattern 116 may have a rectangular parallelepiped shape (for example) that may extend in the first horizontal direction (direction I-I'). The third opening 114 may have a cross sectional shape substantially identical that of the first opening 110.

Figure 15:
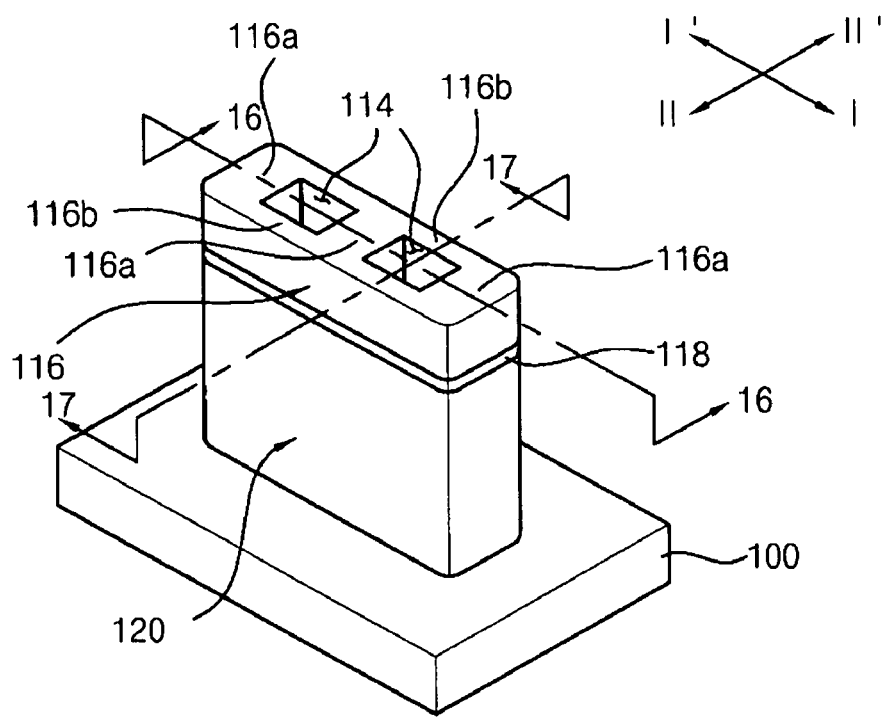
Figure 16:
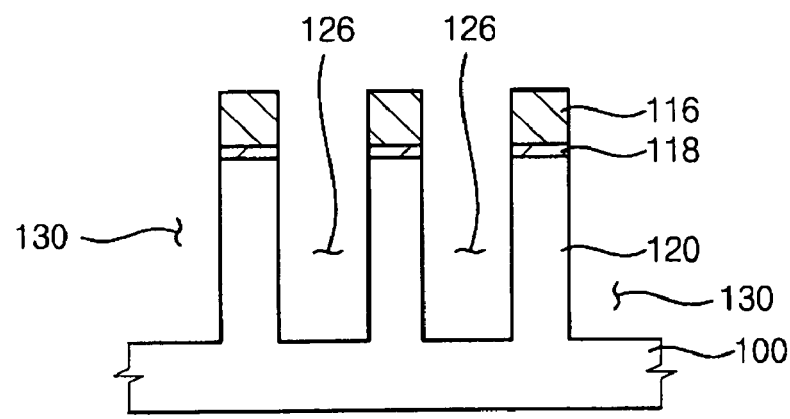
Figure 17:
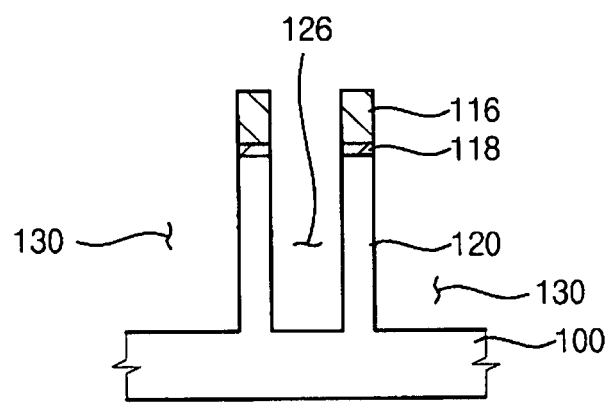

FIG. 15 is a perspective view a fin structure that may protrude from the semiconductor substrate. FIG. 16 is a cross-sectional view taken along the line 16-16 shown in FIG. 15. FIG. 17 is a cross-sectional view taken along the line 17-17 shown in FIG. 15.

Referring to FIGS. 15 to 17, the polysilicon spacer 108 and second mask pattern 112 may be removed. The semiconductor substrate 100 may be anisotropically etched (for example) using the first mask pattern 116 as an etching mask to form a fin structure 120. By way of example only, the fin structure 120 may protrude from the semiconductor substrate 100 in the vertical direction. The fin structure 120 may extend in the first horizontal direction (direction I-I'). For example, an upper portion of the semiconductor substrate 100 may be anisotropically etched to form a trench 130 and a fourth opening 126. The fin structure 120 may have a height of about 2,000 Å to 3,000 Å, for example.

Figure 18:
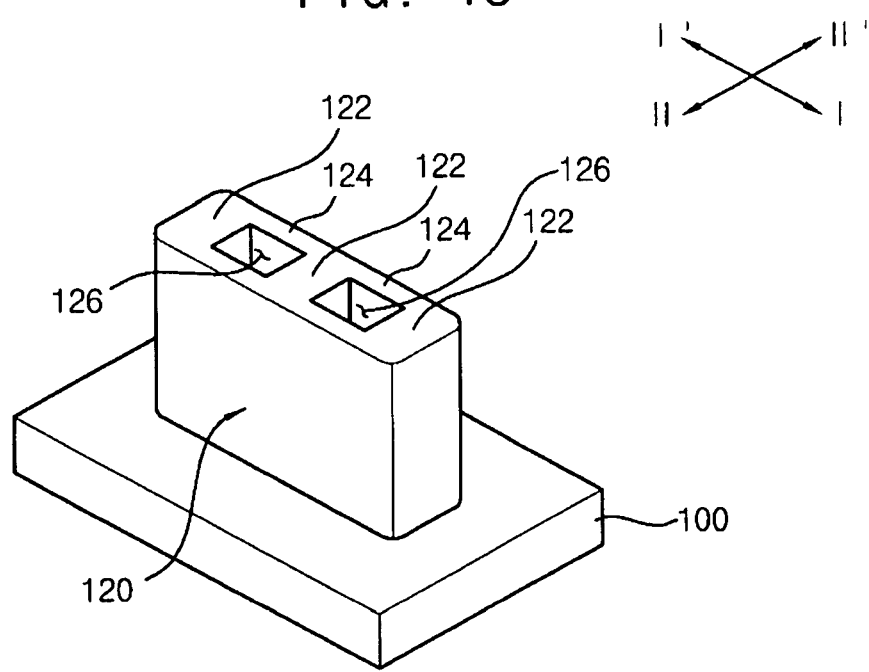

Referring to FIG. 18, which does not illustrate the first mask pattern 116 and the pad oxide layer pattern 118 for clarity, the fin structure 120 may include source/drain patterns 122 and channel fins 124. The source/drain patterns 122 may correspond to source/drain regions. The source/drain patterns 122 may protrude from the semiconductor substrate 100 in the vertical direction. The channel fins 124 may be connected between the source/drain patterns 122. The source/drain patterns 122 may be spaced apart from each other in the first horizontal direction (direction I-I'). The channel fins 124 may be arranged between the source/drain patterns 122. The channel fins 124 may extend in the first horizontal direction (direction I-I'). The channel fins 124 may be parallel to each other. Due to the presence of the fourth opening 126, which may partially expose the semiconductor substrate 100, the channel fins 124 may be spaced apart from each other in the second horizontal direction (direction II-II').

As illustrated in FIG. 18, upper faces of the source/drain patterns 122 may lie on a plane substantially identical to that on which upper faces of the channel fins 124 lie. That is, the upper faces of the source/drain patterns 122 and the upper faces of the channel fins 124 may be substantially coplanar. The channel fins 124 may have extension lengths in the first horizontal direction (direction I-I') that may be substantially identical to each other.

By way of example only, a cross sectional shape of the fin structure 120 may be substantially identical to that of the first mask pattern 116. Turning briefly back to FIG. 15, the first mask pattern 116 may include main patterns 116a corresponding to the source/drain patterns 122 and connection patterns 116b corresponding to the channel fins 124. The main patterns 116a and the connection patterns 116b may define the third opening 114.

Figure 19:
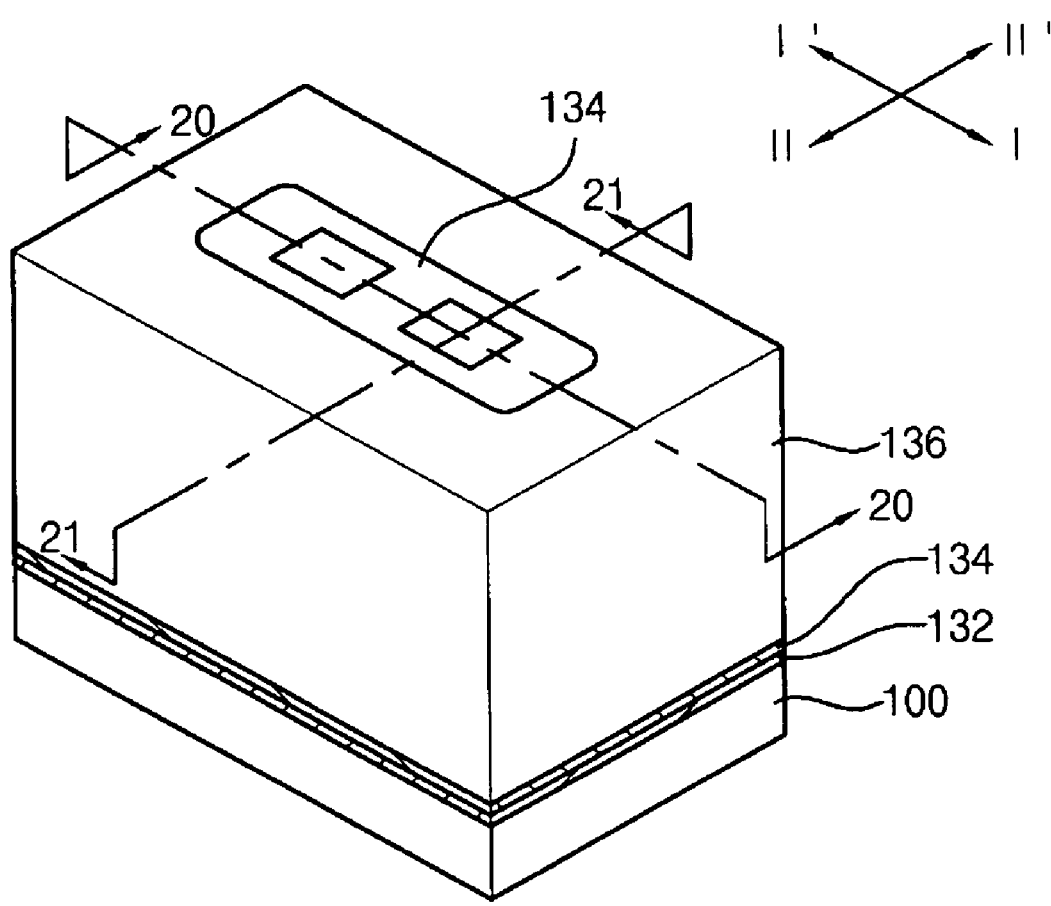
Figure 20:
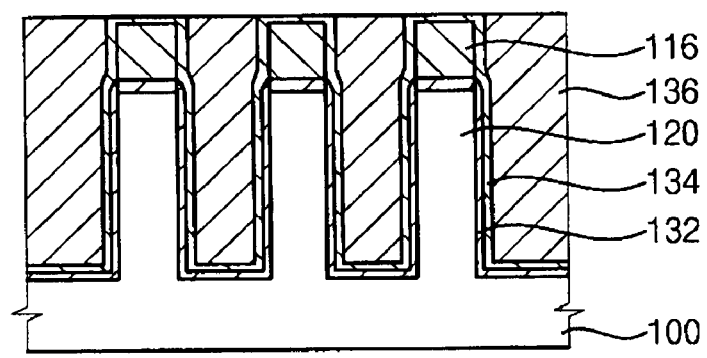
Figure 21:
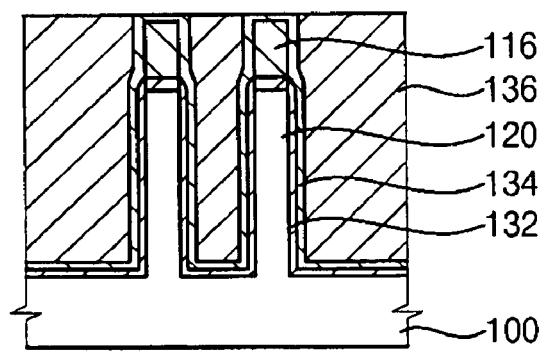

FIG. 19 is a perspective view of a first field insulation layer that may be formed on the semiconductor substrate. FIG. 20 is a cross-sectional view taken along the line 20-20 shown in FIG. 19. FIG. 21 is a cross-sectional view taken along the line 21-21 shown in FIG. 19.

Referring to FIGS. 19 to 21, a trench oxide layer 132, which may have a thickness of about 50 Å to about 100 Å (for example), may be formed on faces of the trench 130 and the fin structure 120 by a thermal oxidation process, for example. The trench oxide layer 132 may cure damages to the fin structure 120 and/or the semiconductor substrate 100, which may be generated (for example) when forming the fin structure 120. The trench oxide layer 132 may suppress a current leakage.

A nitride layer 134, which may have a thickness of about 50 Å to about 100 Å (for example), may be formed on the trench oxide layer 132 and the first mask pattern 116. The nitride layer 134 may prevent impurities included in a first field insulation layer 136 from diffusing into the fin structure 120 and/or the semiconductor substrate 100.

The first field insulation layer 136, which may have a thickness of from about 4,000 Å to about 6,000 Å (for example), may be formed on the nitride layer 134. The first field insulation layer 136 may be planarized so that the nitride layer 134 and/or the first mask pattern 116 may be exposed. For example, the first field insulation layer 136 may include silicon oxide, for example. The silicon oxide may be undoped silicate glass (USG) and/or high density plasma (HDP) oxide, for example. These materials may be used alone or in combination. The first field insulation layer 136 may be planarized by a chemical mechanical polishing (CMP) process, for example.

Figure 22:
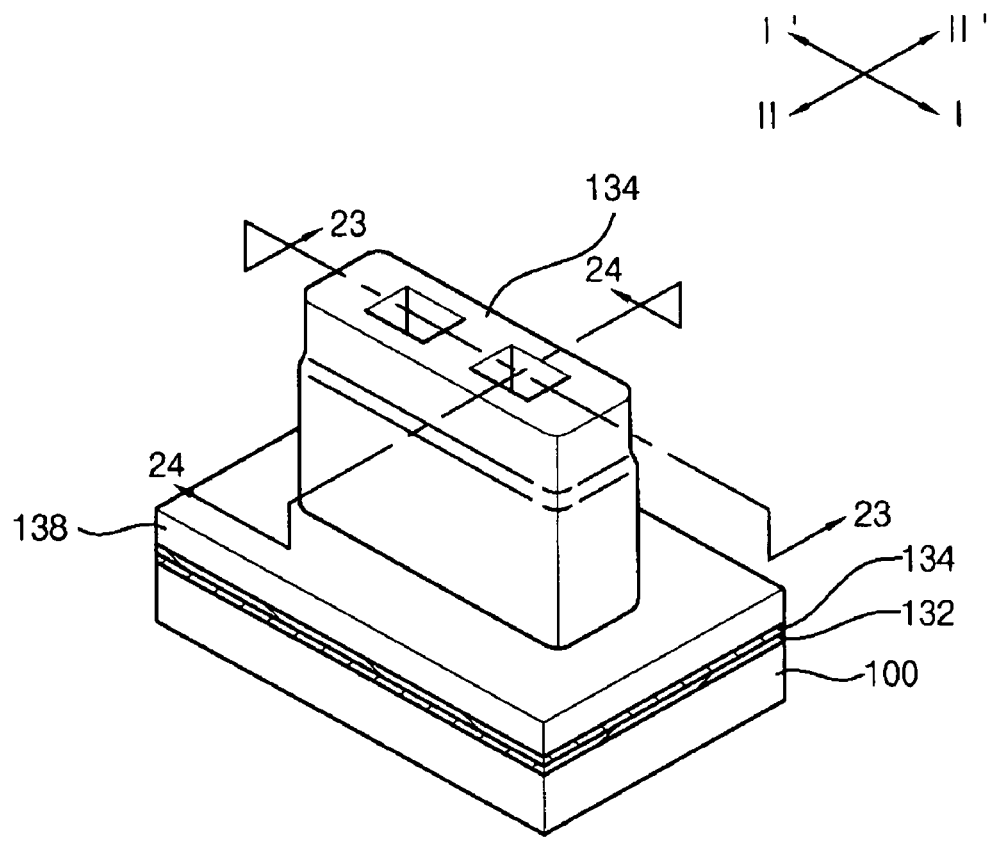
Figure 23:
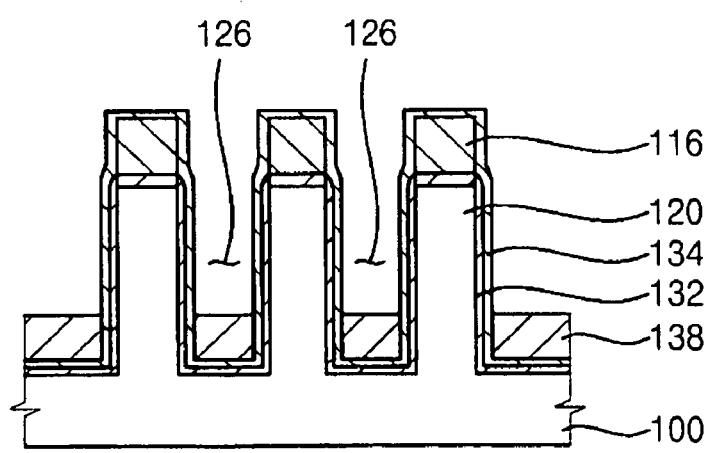
Figure 24:
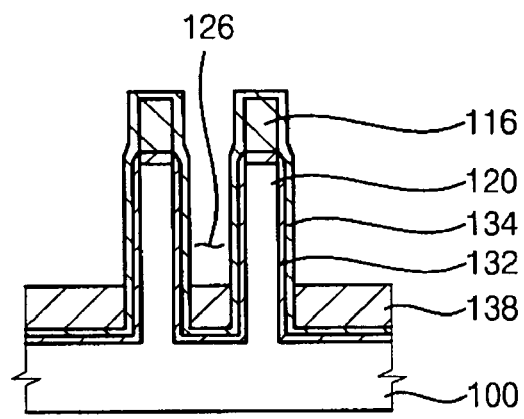

FIG. 22 is a perspective view of a first field insulation pattern that may serve as an isolation pattern. FIG. 23 is a cross-sectional view taken along the line 23-23 shown in FIG. 22. FIG. 24 is a cross-sectional view taken along the line 24-24 shown in FIG. 22.

Referring to FIGS. 22 to 24, after planarizing the first field insulation layer 136, an upper portion of the first field insulation layer 136 may be removed to form a first field insulation pattern 138, which may serve as an isolation pattern. For example, the upper portion of the first field insulation layer 136 may be removed using an etchant (for example) having an etching selectivity between the first field insulation layer 136 and the nitride layer 134. A lower portion of the trench 130 may be filled with the first field insulation pattern 138. That is, the first field insulation layer 138 may be positioned between lower portions of the fin structure 120. Thus, an upper portion of the fin structure 120 may protrude from an upper face of the first field insulation pattern 138.

Figure 25:
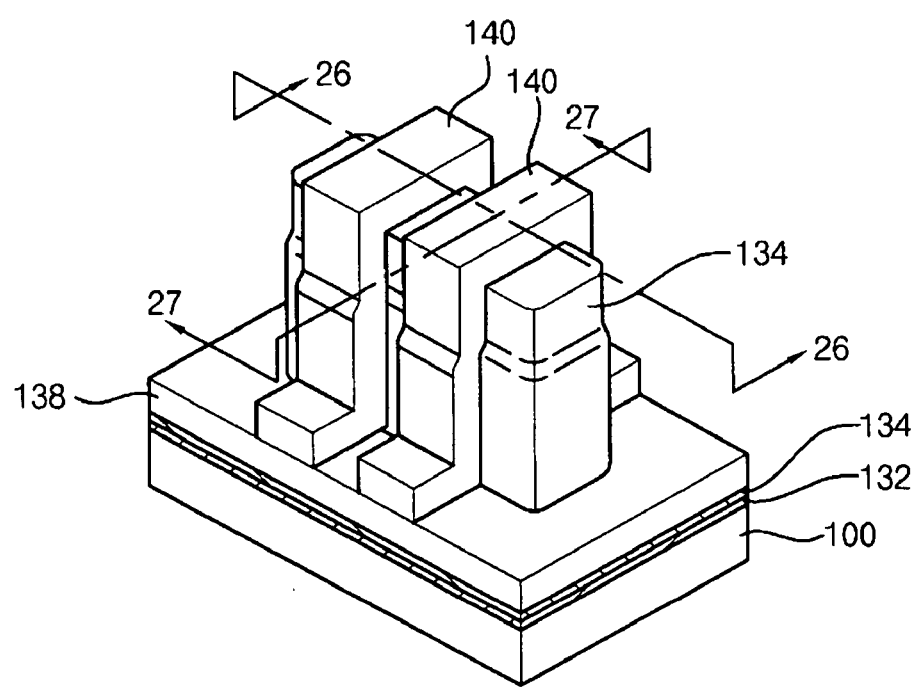
Figure 26:
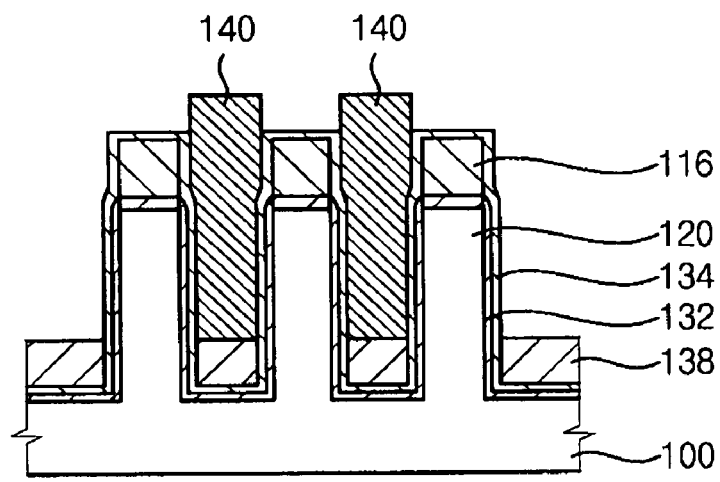
Figure 27:
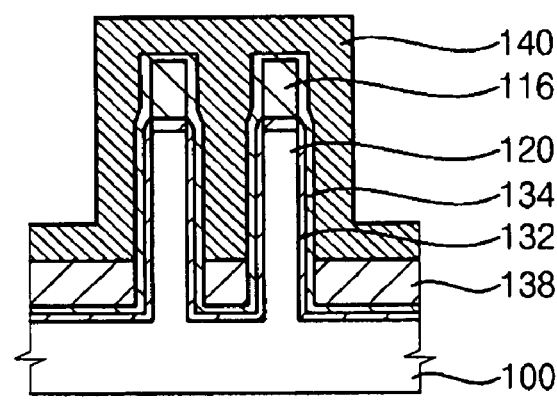

FIG. 25 is a perspective view of a sacrificial pattern that may be formed on the fin structure 120. FIG. 26 is a cross-sectional view taken along the line 26-26 shown in FIG. 25. FIG. 27 is a cross-sectional view taken along the line 27-27 shown in FIG. 25.

Referring to FIGS. 25 to 27, a sacrificial layer (not shown), which may have a thickness of about 300 Å to about 500 Å (for example), may be formed on the first field insulation pattern 138. The sacrificial layer may fill the lower portion of the trench 130 and the upper portion of the fin structure 120, which may protrude from the upper face of the first field insulation pattern 138. The sacrificial layer may include polysilicon, for example. The sacrificial layer may be formed by an LPCVD process (for example) to fill the fourth opening 126 positioned between the channel fins 124.

A third photoresist pattern (not shown) may be formed on the sacrificial layer. The sacrificial layer may be anisotropically etched (for example) using the third photoresist pattern as an etching mask to form a sacrificial pattern 140 on the fin structure 120. The sacrificial pattern 140 may be formed on the channel fins 124 of the fin structure 120. The sacrificial pattern 140 may extend in the second horizontal direction (direction II-II'). For example, the sacrificial pattern 140 may be formed on the nitride layer 134 on the channel fins 124.

Impurities may be implanted into the source/drain patterns 122 of the fin structure 120 to change electrical characteristics of the source/drain patterns 122. The impurities may include arsenic (As), phosphorus (P), and/or boron (B), for example. These impurities may be used alone or in combination. During the ion implantation process, an ion beam may be irradiated onto the source/drain patterns 122 at a slanted direction (for example) with respect to the semiconductor substrate 100.

Alternatively, the ion implantation process may be performed after a sacrificial spacer 142 (see FIG. 28) and a sacrificial plug 144 (see FIG. 28) may be formed, by partially removing the sacrificial pattern 140. Also, the ion implantation process may be performed after the first mask pattern 116, which may be partially exposed through the sacrificial pattern 140, may be partially removed. Further, before forming the first mask layer 104 on the pad oxide layer 102, an ion implantation mask may be formed on the pad oxide layer 102. The ion implantation process may then be performed.

Figure 28:
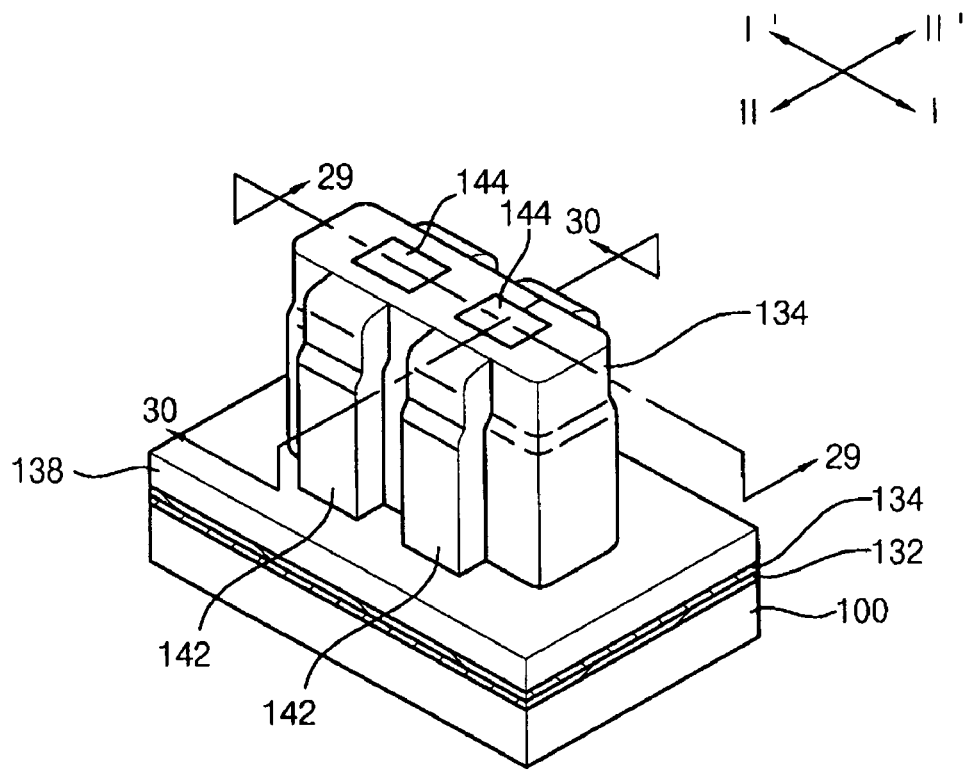
Figure 29:
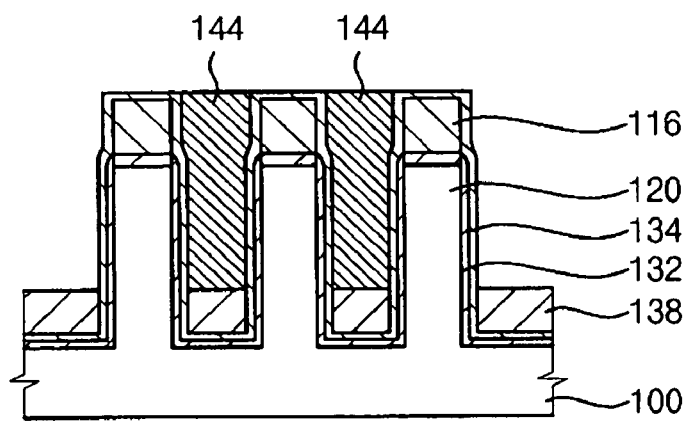
Figure 30:
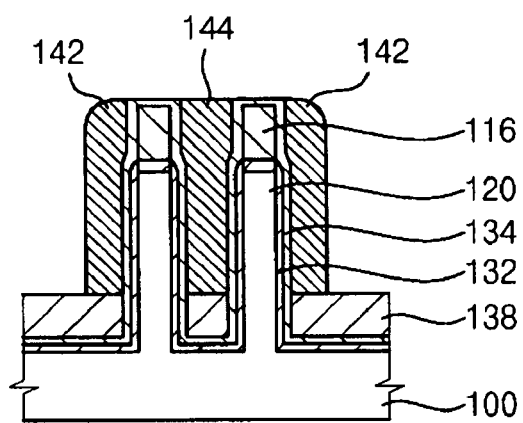

FIG. 28 is a perspective view of a sacrificial spacer that may be formed by partially removing the sacrificial pattern. FIG. 29 is a cross-sectional view taken along the line 29-29 shown in FIG. 28. FIG. 30 is a cross-sectional view taken along the line 30-30 shown in FIG. 28.

Referring to FIGS. 28 to 30, an etch-back process (for example) may be performed on the sacrificial pattern 140 to form the sacrificial spacer 142. For example, the sacrificial pattern 140 may be partially etched so that the nitride layer 134, which may be formed on the channel fins 124, may be exposed to form the sacrificial spacer 142. The sacrificial spacer 142 may be provided on a sidewall of the nitride layer 134, which may be formed on a sidewall of the fin structure 120. A sacrificial plug 144, which may fill the fourth opening 126 that may be positioned between the channel fins 124, may be formed with the sacrificial spacer 142.

Figure 31:
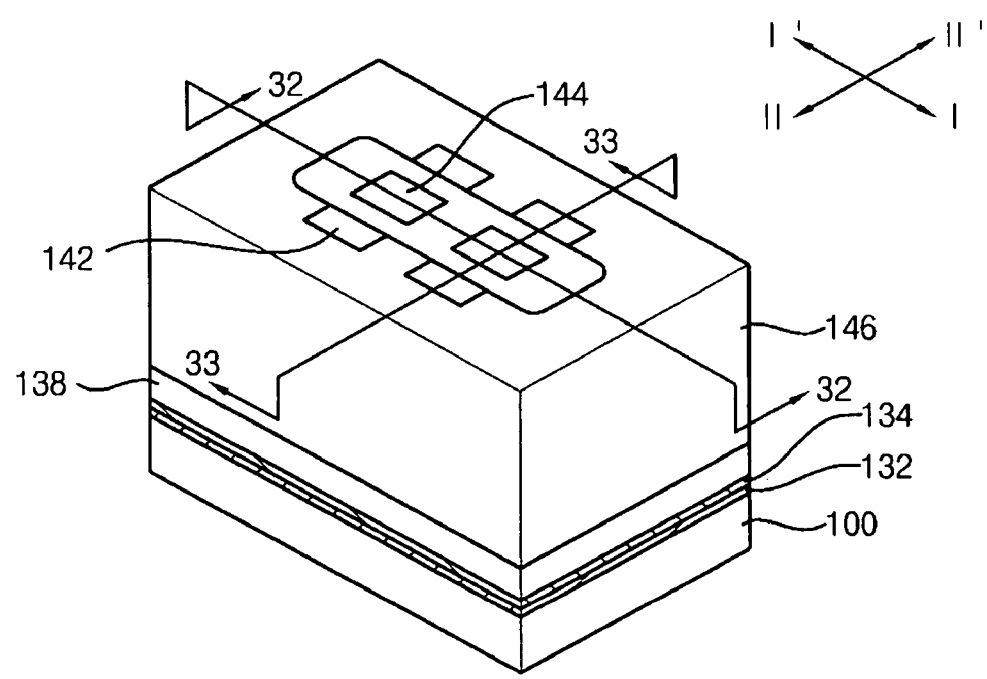
Figure 32:
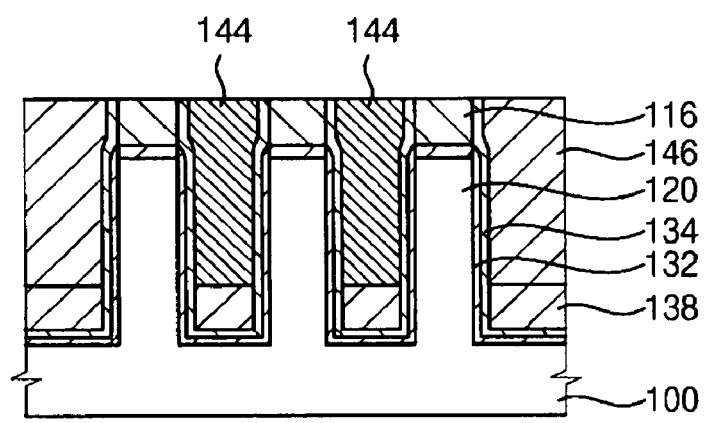
Figure 33:
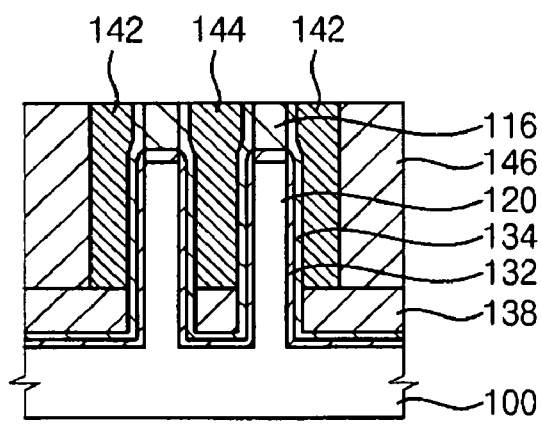

FIG. 31 is a perspective view of a second field insulation pattern. FIG. 32 is a cross-sectional view taken along the line 32-32 shown in FIG. 31. FIG. 33 is a cross-sectional view taken along the line 33-33 shown in FIG. 31.

Referring to FIGS. 31 to 33, a second field insulation layer (not shown) may be formed on the first field insulation pattern 138, the liner nitride layer 134, the sacrificial plug 144 and the sacrificial spacer 142. The second field insulation layer may be planarized by a CMP process (for example) to form a second field insulation pattern 146 on the first field insulation pattern 138. The second field insulation pattern 146 may include material similar or identical to that of the first field insulation pattern 138. The second field insulation pattern 146 may be formed by a CMP process, for example. The CMP process may be performed so that the sacrificial spacer 142 and the sacrificial plug 144 may be exposed. The sidewalls of the sacrificial spacer 142 may have vertical profiles after the CMP process is performed. For example, the rounded portions of an upper portion of the sacrificial spacer 142 may be removed by the CMP process, for example.

Figure 34:
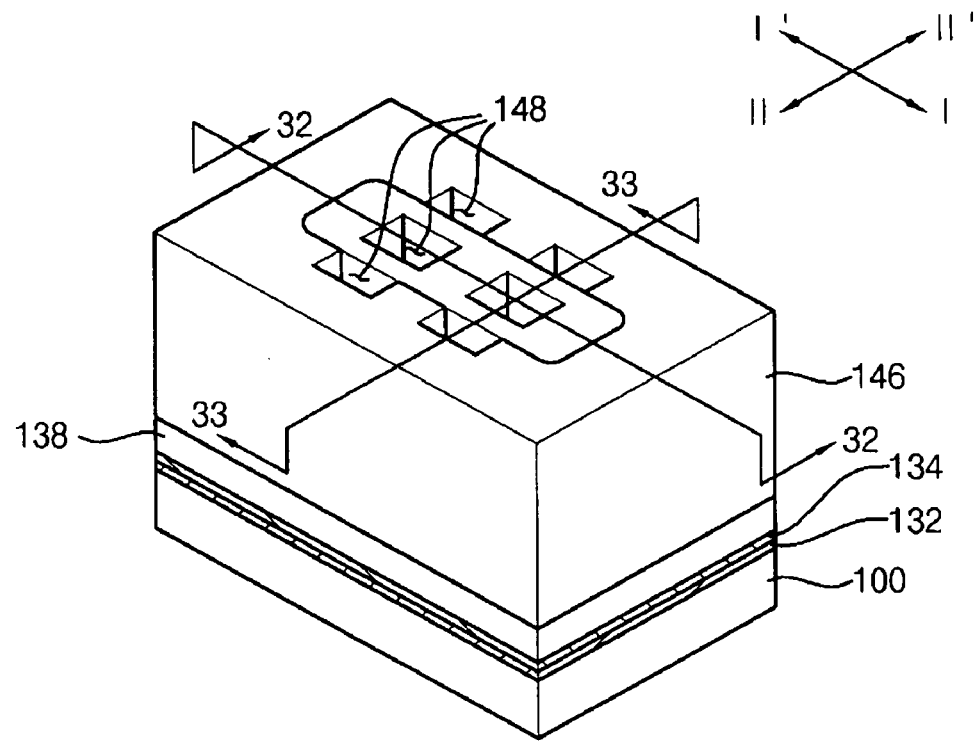
Figure 35:
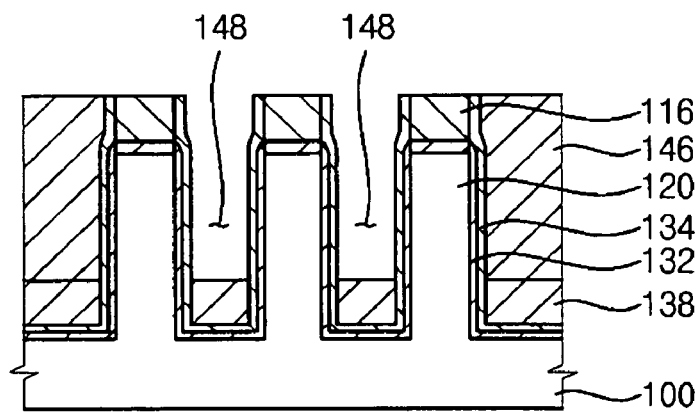
Figure 36:
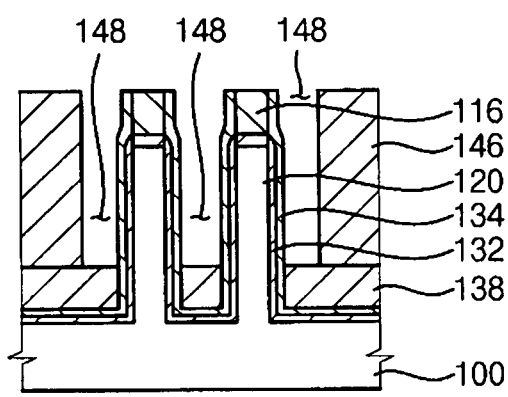

FIG. 34 is a perspective view of fifth openings in which lower gate patterns may be formed. FIG. 35 is a cross-sectional view taken along the line 35-35 shown in FIG. 34. FIG. 36 is a cross-sectional view taken along the line 36-36 shown in FIG. 34.

Referring to FIGS. 34 to 36, the sacrificial spacer 142 and the sacrificial plug 144 may be removed to form fifth openings 148 in which the lower gate patterns 152 (see FIGS. 1 and 2) may be formed. For example, the sacrificial spacer 142 and the sacrificial plug 144 may be removed using an etchant (for example) having a selectivity between polysilicon and silicon oxide and silicon nitride. The etchant may include ammonium hydroxide ($NH_4OH$), hydrogen peroxide ($H_2O_2$) and/or pure water ($H_2O$), for example. These materials may be used alone in combination.

Figure 37:
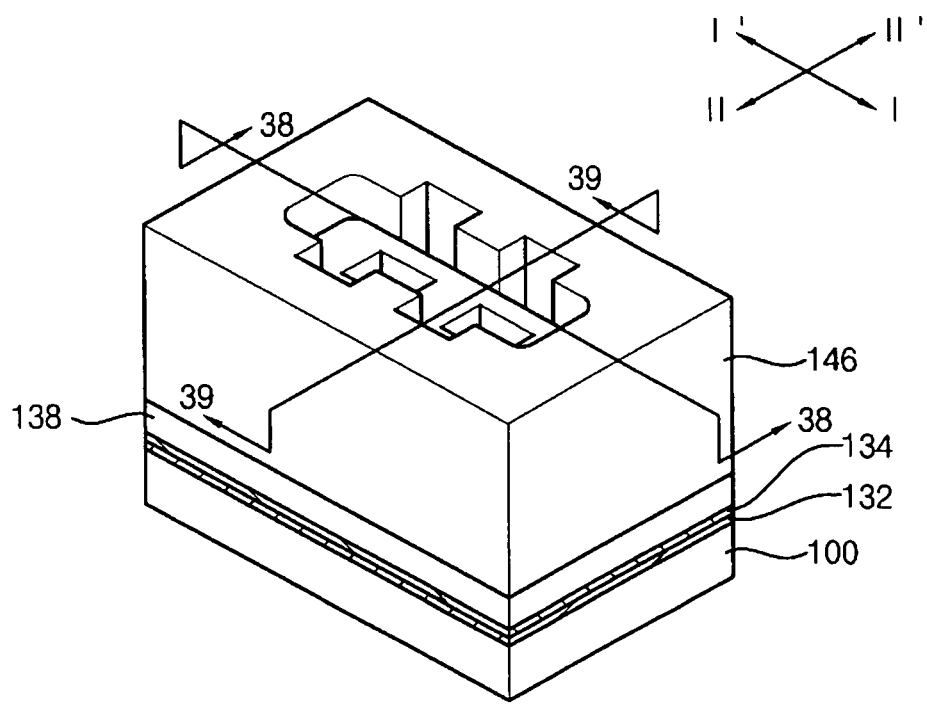
Figure 38:
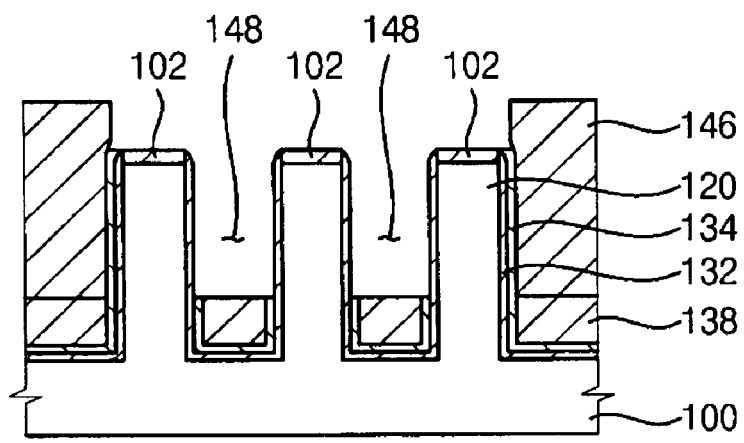
Figure 39:
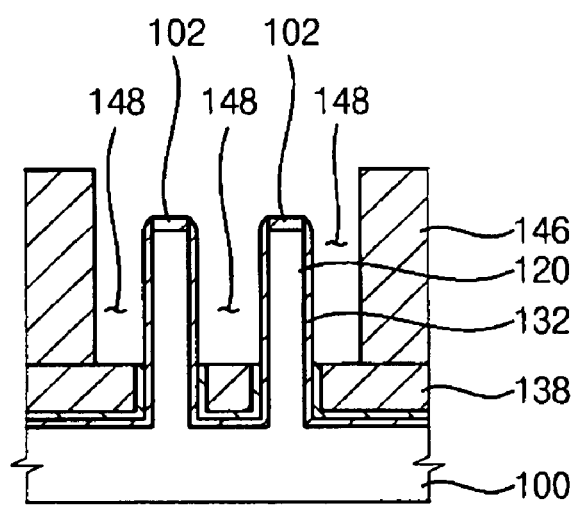

FIG. 37 is a perspective view of the pad oxide layer and the trench oxide layer that may be partially exposed after the nitride layer and the first mask pattern may be removed. FIG. 38 is a cross-sectional view taken along the line 38-38 shown in FIG. 37. FIG. 39 is a cross-sectional view taken along the line 39-39 shown in FIG. 37.

Referring to FIGS. 37 to 39, the nitride layer 134 and the first mask pattern 116 may be removed by a wet etching process (for example) so that the pad oxide layer 102 and the trench oxide layer 132 (which may be formed on the fin structure 120) may be partially exposed. The nitride layer 134 and the first mask pattern 116 may be removed using an etchant including phosphoric acid, for example.

Figure 40:
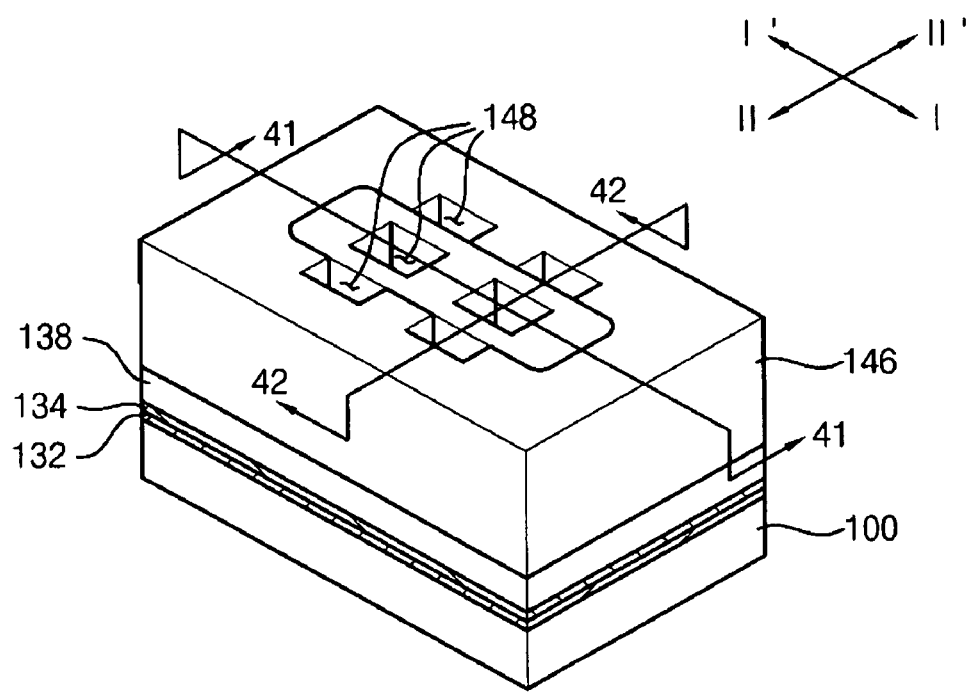
Figure 41:
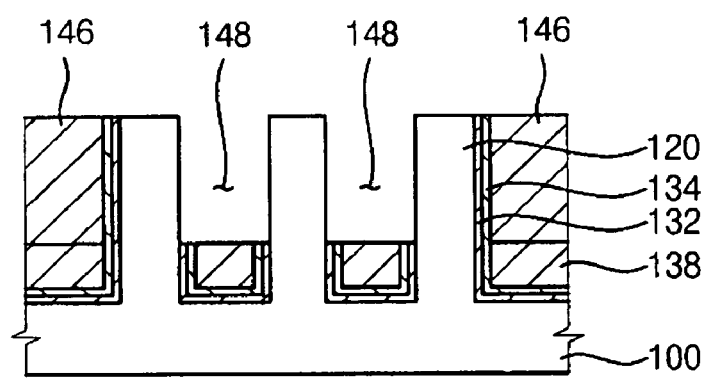
Figure 42:
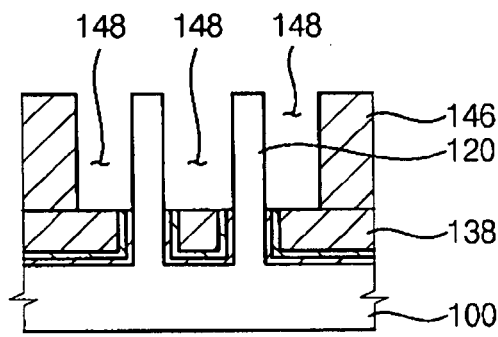

FIG. 40 is a perspective view of the fin structure that may be partially exposed by partially removing the pad oxide layer 102 and trench oxide layer 132. FIG. 41 is a cross-sectional view taken along the line 41-41 shown in FIG. 40. FIG. 42 is a cross-sectional view taken along the line 42-42 shown in FIG. 40.

Referring to FIGS. 40 to 42, the pad oxide layer 102 (which may be provided on an upper face of the fin structure 120) and a portion of the trench oxide layer 132 (which may be provided on inner sidewalls of the fifth openings 148) may be removed so that the fin structure 120 may be partially exposed. For example, the pad oxide layer 102 and the portion of the trench oxide layer 132 may be removed using a diluted hydrofluoric acid solution, for example. While the pad oxide layer 102 and the portion of the trench oxide layer 132 are removed, an upper portion of the second field insulation pattern 146 may be removed.

Figure 43:
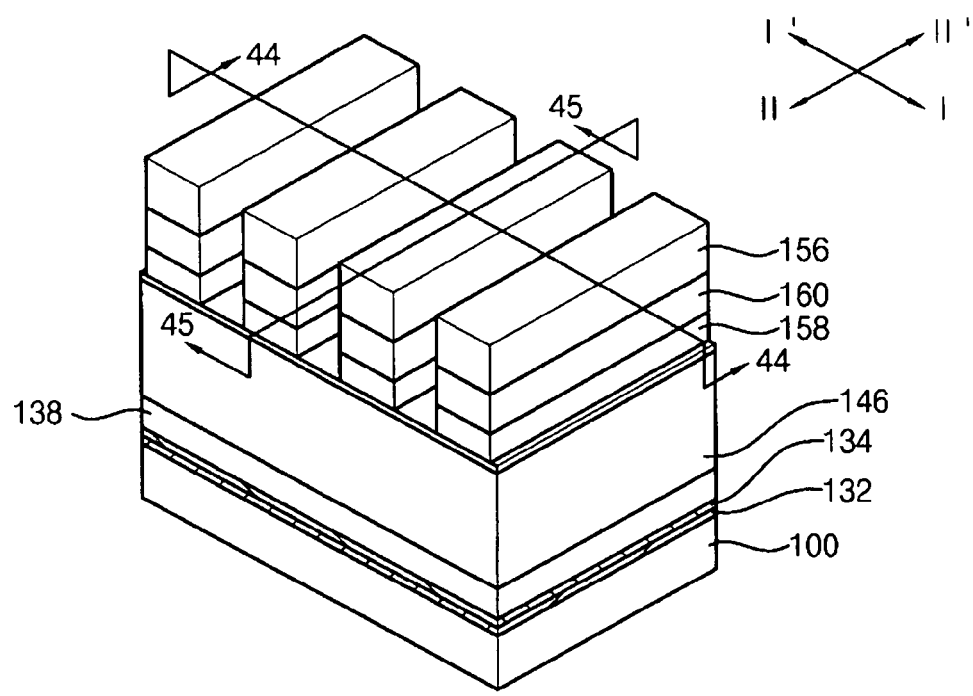
Figure 44:
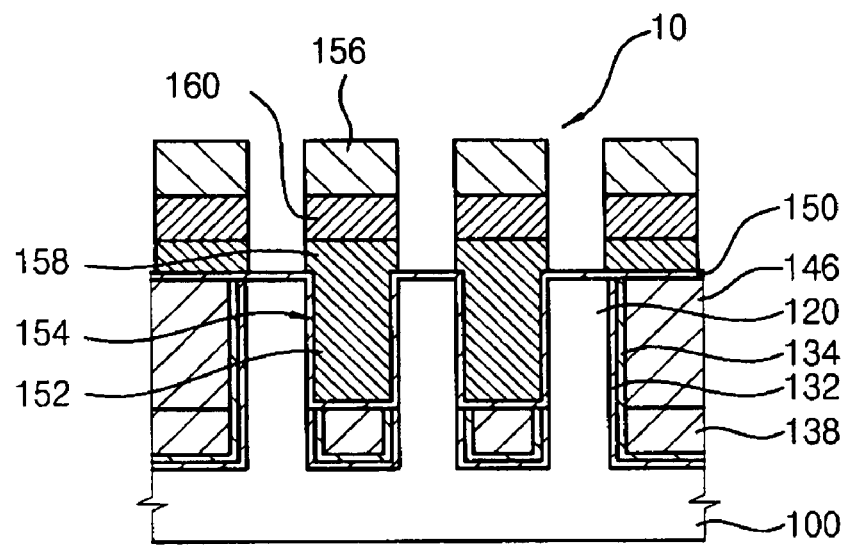
Figure 45:
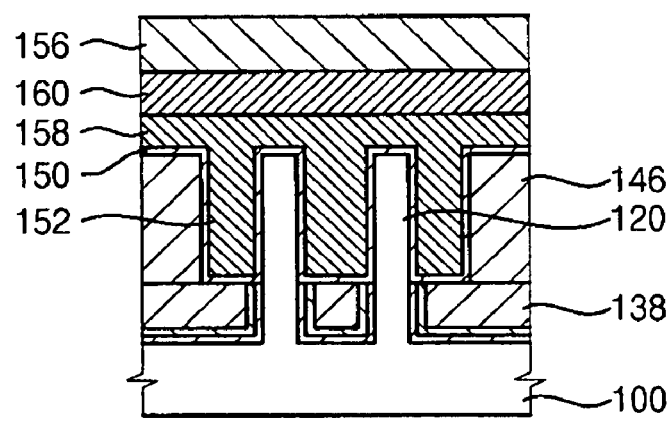

FIG. 43 is a perspective view of a gate electrode that may be formed on the channel fins. FIG. 44 is a cross-sectional view taken along the line 44-44 shown in FIG. 43. FIG. 45 is a cross-sectional view taken along the line 45-45 shown in FIG. 43.

Referring to FIGS. 43 to 45, a gate insulation layer 150 may be formed on portions of the channel fins 124, which may be exposed through the fifth openings 148. The gate insulation layer 150 may include material having a high dielectric constant, for example. The gate insulation layer 150 may be formed by an atomic layer deposition (ALD) process, a metal organic chemical vapor deposition (MOCVD) process, a physical vapor deposition (PVD) process, for example. The material having a high dielectric constant may include hafnium oxide ($HfO_2$), zirconium oxide ($ZrO_2$), lanthanum oxide ($La_2O_3$), tantalum pentoxide ($Ta_2O_5$), titanium oxide ($TiO_2$), strontium titanate ($SrTiO_3$), and/or barium strontium titanate (($Ba,Sr)TiO_3$), for example. These materials may be used alone or in combination.

Alternatively, the gate insulation layer 150 may include silicon oxide and/or silicon oxynitride, for example. The gate insulation layer 150 may be formed by a thermal oxidation process and/or a nitridation process, for example.

A first conductive layer (not shown), which may have a thickness of about 500 Å to about 1,000 Å (for example), may be formed on the gate insulation layer 150. The first conductive layer may fill the fifth openings 148. The first conductive layer may include polysilicon doped with impurities, for example. The polysilicon doped with the impurities may be formed by a LPCVD process and an impurity doping process, for example. For example, while the LPCVD process may be performed to form a polysilicon layer, the impurity doping process may be performed with the LPCVD process in-situ to dope the impurities into the polysilicon layer.

Alternatively, after forming the polysilicon layer by the LPCVD process, the impurity doping process may be performed on the polysilicon layer to form the conductive layer. The impurity doping process may be an ion implantation process and/or an impurity diffusion process, for example. These processes may be implemented alone or in combination.

The first conductive layer may be used to form the lower gate patterns. The lower gate patterns 152 may contact sidewalls of the gate insulation layer 150. The lower gate patterns 152 may extend in the vertical direction.

A second conductive layer (not shown), which may have a thickness of about 500 Å to about 1,000 Å (for example), may be formed on the first conductive layer. The second conductive layer may include metal silicide, for example. The second conductive layer may be formed by a metal deposition process and/or a silicidation process, for example. For example, a metal layer may be formed on the first conductive layer. The second conductive layer, which may include the metal silicide, may be formed by a reaction between silicon in the first conductive layer and metal in the metal layer. The metal silicide may include tungsten silicide ($WSi_x$), titanium silicide ($TiSi_x$), cobalt silicide ($CoSi_x$), and/or tantalum silicide ($TaSi_x$), for example. These materials may be used alone or in combination.

A capping layer (not shown), which may have a thickness of about 1,000 Å to about 2,000 Å (for example), may be formed on the second conductive layer. The capping layer may include silicon nitride, for example. The capping layer may be formed by an LPCVD process, for example.

The first conductive layer, the second conductive layer and the capping layer may be patterned to form a gate structure including a gate electrode 154 and a capping pattern 156. For example, the gate electrode 154 may include the lower gate patterns 152, an upper gate pattern 158 and a metal silicide pattern 160. The first conductive layer may be patterned to form the upper gate pattern 158, which may be connected to an upper portion of the lower gate pattern 152.

As illustrated in FIGS. 43 to 45, the upper gate pattern 158 may contact upper faces of the gate insulation layer 150. The lower gate patterns 152 may extend in the vertical direction from the upper gate pattern 158 toward the semiconductor substrate 100. The lower gate patterns 152 may contact the sidewalls of the gate insulation layer 150. The metal silicide pattern 160 may be formed on the upper gate pattern 158.

Figure 46:
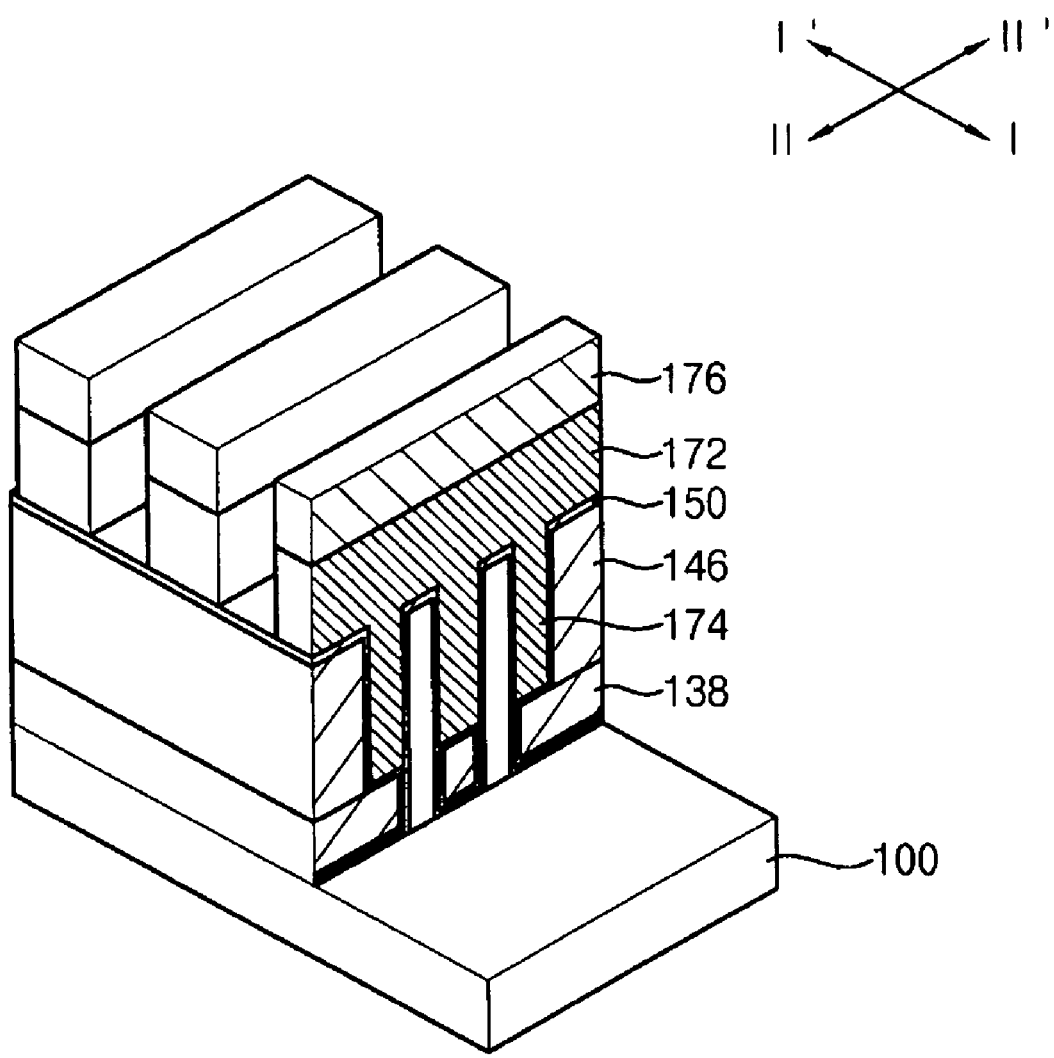

Alternatively, as illustrated in FIG. 46, a gate structure may include an upper gate pattern 172, lower gate patterns 174, and a capping layer 176. The upper gate pattern 172 may extend in the second horizontal direction (direction II-II'). The lower gate patterns 174 may extend in the vertical direction from the upper gate pattern 172 toward the semiconductor substrate 100. The capping layer may be formed on the upper gate pattern 172. The upper gate pattern 172 and the lower gate patterns 174 may include polysilicon doped with impurities, for example.

As illustrated in FIGS. 43 to 45, the lower gate patterns 152 may have extension lengths in the first horizontal direction (direction I-I') substantially identical to each other. The channel fins 124 may have extension lengths in the first horizontal direction substantially identical to each other. Widths of the upper gate pattern 158 and the lower gate patterns 152 in the first horizontal direction (direction I-I') may be substantially identical to each other. The widths of the upper gate pattern 158 and the lower gate patterns 152, and the extension lengths of the channel fins 124 may be substantially identical to each other.

Thicknesses of the channel fins 124 may vary in accordance with a width of the polysilicon spacer 108. The number of the channel fins 124 may vary in accordance with a shape of the second mask pattern 112. The channel fins 124 may be formed using polysilicon spacers 108, for example.

As described above, the shape and number of the channel fins 124 may vary, and therefore a short channel effect and a narrow channel effect may be suppressed.

FIGS. 47 to 52 are schematic views of an example method that may be implemented to manufacture a semiconductor device in accordance with another example, non-limiting embodiment of the present invention.

In this example, non-limiting embodiment, a fin structure 220, a first field insulation pattern 238, a second field insulation pattern 246, a first mask pattern 216, a trench oxide layer 232 and a nitride layer 234 may be formed on a semiconductor substrate 200. The above-described elements may be formed by processes similar or identical to those described with reference to FIGS. 3 to 36. Thus, further explanations of these elements will be omitted.

Figure 47:
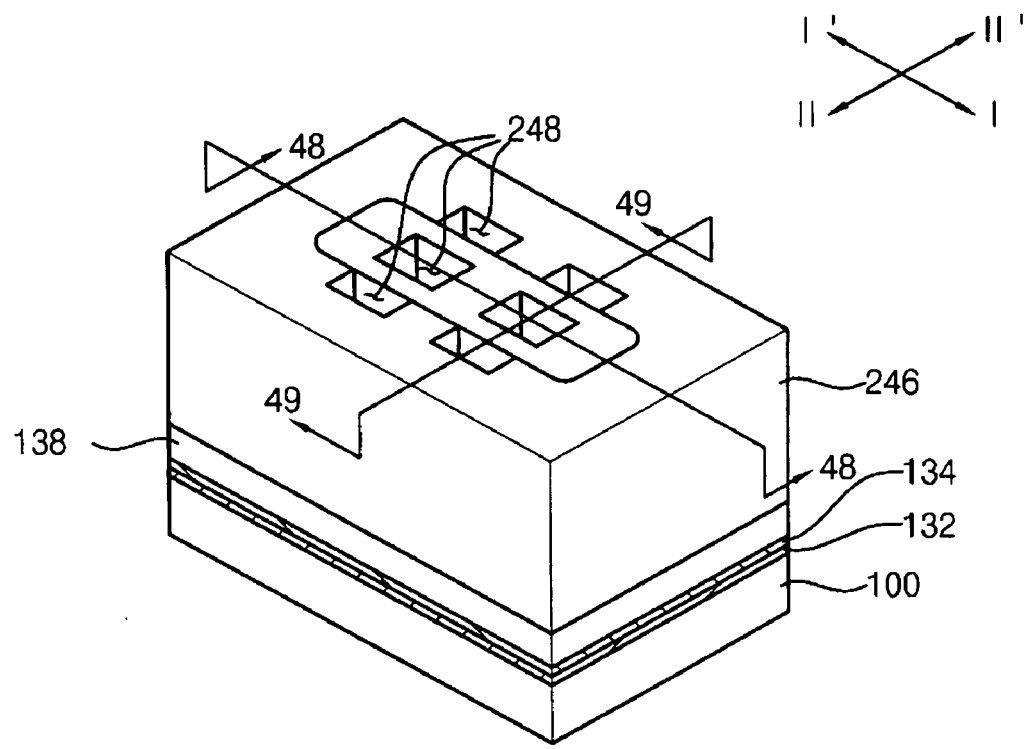
FIGS. 47 to 52 are schematic views of an example method that may be implemented to manufacture a semiconductor device in accordance with another example, non-limiting embodiment of the present invention.
Figure 48:
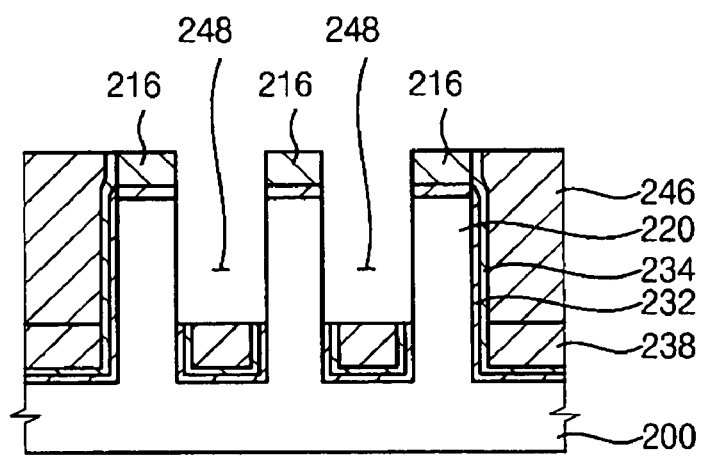
Figure 49:
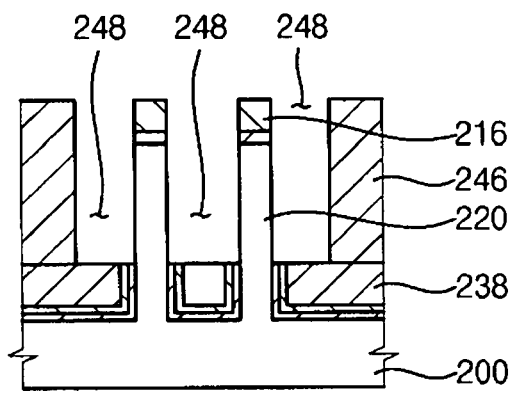

FIG. 48 is a cross-sectional view taken along the line 48-48 of FIG. 47, and FIG. 49 is a cross-sectional view taken along the line 49-49 of FIG. 47. Referring to FIGS. 47 to 49, portions of nitride layer 234, which may be exposed through fifth openings 248, may be removed using an etchant (for example) having an etching selectivity between the nitride layer 234 and the second field insulation pattern 246. The etchant may include phosphoric acid, for example. An upper face portion of the first mask pattern 216 may be partially removed while the portions of the nitride layer 234 are removed.

A portion of the trench oxide layer 232, which may be exposed by removing the portions of the nitride layer 234, may be removed. For example, the portion of trench oxide layer 232 may be removed using an etchant (for example) having an etching selectivity between the trench oxide layer 232 and the first mask pattern 216. The etchant may be a diluted hydrofluoric acid solution, for example. The second field insulation pattern 246 and the first field insulation pattern 238, which may be exposed through the fifth openings 248, may be partially removed in removing the portion of the trench oxide layer 232.

Figure 50:
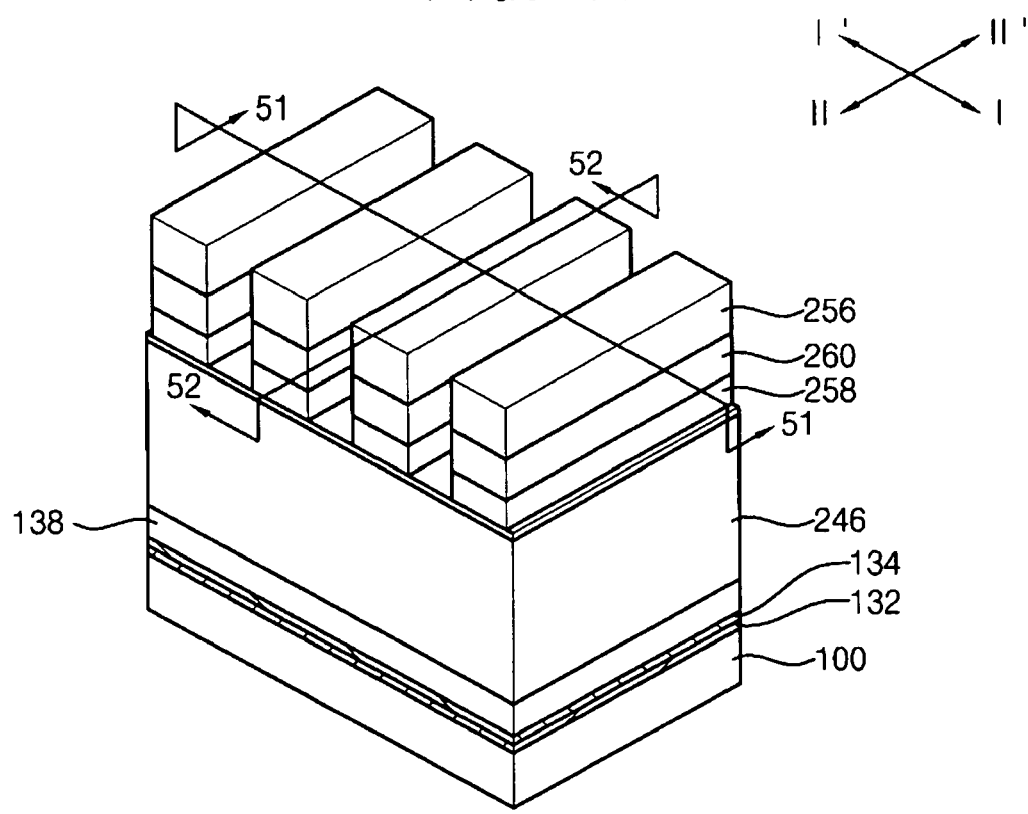
Figure 51:
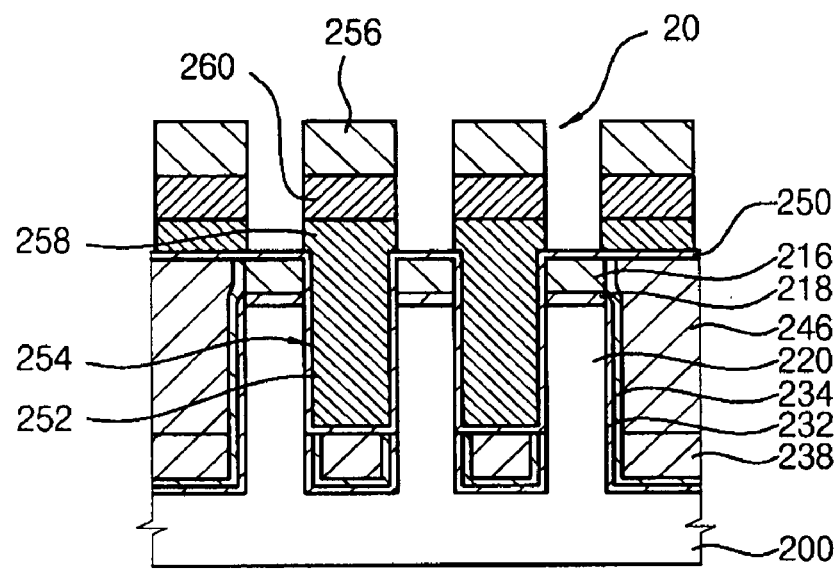
Figure 52:
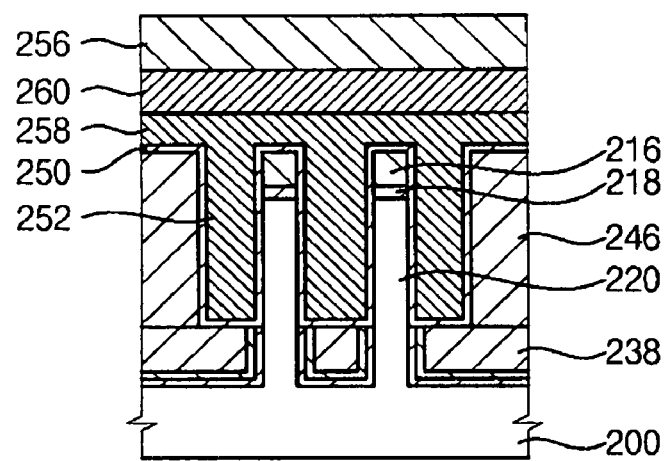

FIG. 51 is a cross-sectional view taken along the line 51-51 of FIG. 50, and FIG. 52 is a cross-sectional view taken along the line 52-52 of FIG. 50. Referring to FIGS. 50 to 52, a gate insulation layer 250 may be formed on sidewalls of channel fins, a sidewall of the pad oxide layer 218, the first mask pattern 216, the first field insulation pattern 238, and the second field insulation pattern 246. The sidewalls of channel fins may be exposed through the fifth holes 248. The gate insulation layer 250 may include material having a high dielectric constant, for example. The gate insulation layer 250 may be formed by an ALD process, an MOCVD process and/or a PVD process, for example. Alternatively, the gate insulation layer 250 may include silicon oxide and/or silicon oxynitride, for example. The gate insulation layer 250 may be formed by a thermal oxidation process and/or a nitridation process, for example.

A first conductive layer (not shown) may be formed on the gate insulation layer 250. The first conductive layer may fill the fifth openings 248. A second conductive layer (not shown) may be formed on the first conductive layer. The first conductive layer may include polysilicon doped with impurities, for example. The second conductive layer may include metal silicide, for example. A capping layer (not shown) may be formed on the second conductive layer.

The first conductive layer, the second conductive layer and the capping layer may be patterned to form a gate structure including a gate electrode 254 and a capping pattern 256. The gate electrode 254 may extends in a first horizontal direction (direction I-I'). The gate electrode 254 may include an upper gate pattern 258, lower gate patterns 252, and a metal silicide pattern 260. The upper gate pattern 258 may contact upper faces of the gate insulation layer 250. The lower gate patterns 252 may extend in the vertical direction from the upper gate patterns 258 toward the semiconductor substrate 200. The lower gate patterns 252 may contact sidewalls of the gate insulation layer 250. The metal silicide pattern 260 may be formed on the upper gate pattern 258. When the gate insulation layer 250 is formed at sidewall portions of the channel fins by a thermal oxidation process, for example, the upper gate pattern 258 may be formed on an upper face on the first mask pattern 216.

According to example, non-limiting embodiments of the present invention, channel regions of a semiconductor device may be formed in channel fins that may be connected between source/drain patterns, which are spaced apart form each other in the first horizontal direction (direction I-I'). Thus, a short channel effect and a narrow channel effect in the semiconductor device may be suppressed by regulating the height, the width and/or the number of the channel fins, for example. Further, a carrier mobility of the semiconductor device may be improved. In addition, a current drivability and an efficiency of the semiconductor device may be improved.

It is to be understood that the example, non-limiting embodiments of the invention defined by the appended claims are not to be limited by particular details set forth in the above description as numerous apparent variations thereof are possible without departing from the spirit or scope of the invention, as claimed.

What is claimed is:

1. A method comprising:
    forming a fin structure on a substrate, the fin structure protruding from the substrate and extending in a first horizontal direction, and including source/drain patterns and channel fins connected between the source/drain patterns;
    forming a gate insulation layer on the channel fins;
    forming lower gate patterns to contact the gate insulation layer and extending in a vertical direction substantially perpendicular to the substrate; and
    forming an upper gate pattern extending in a second horizontal direction that is substantially perpendicular to the first horizontal direction, the upper gate pattern being connected to upper portions of the lower gate patterns,
    wherein at least one of the lower gate patterns is surrounded by the source/drain patterns and the channel fins without spaces between the lower gate patterns and the source/drain patterns and the channel fins.

2. The method of claim 1, wherein forming the fin structure comprises:
    forming a mask pattern on the substrate, the mask pattern having an opening that partially exposes the substrate; and
    anisotropically etching a surface portion of the substrate using the mask pattern as an etching mask to form the fin structure,
    wherein the mask pattern includes main patterns corresponding to the source/drain patterns and connection patterns corresponding to the channel fins, the main patterns and the connection patterns defining the opening.

3. The method of claim 2, wherein forming the mask pattern comprises:
    forming a first mask layer on the substrate;
    forming a second mask layer on the first mask layer;
    patterning the second mask layer to form a preliminary mask pattern extending in the first horizontal direction;
    forming a third mask layer on the first mask layer and the preliminary mask pattern;
    forming a spacer on a sidewall of the preliminary mask pattern by performing an etch-back process on the third mask layer until the preliminary mask pattern is partially exposed;
    forming a photoresist pattern extending in the second horizontal direction on a portion of the preliminary mask pattern;
    anisotropically etching the preliminary mask pattern using the photoresist pattern as an etching mask to form a second mask pattern having a second opening that partially exposes the first mask layer; and
    anisotropically etching the first mask layer using the second mask pattern and the spacer as etching masks to form the mask pattern having the opening.

4. The method of claim 2, wherein forming the gate insulation layer comprises:
    filling a lower portion of a trench in the substrate with a first field insulation pattern, the trench being formed at a surface portion of the substrate by forming the fin structure;
    forming sacrificial spacers and at least one sacrificial plug, the sacrificial spacers being formed on channel fins of the fin structure that protrude from an upper face of the first field insulation pattern and outer side faces of the connection patterns, and the sacrificial plug filing up at least one space between the channel fins and the connection patterns;
    filling a remaining portion of the trench with a second field insulation pattern;
    removing the sacrificial spacers and the at least one sacrificial plug to form an opening partially exposing sidewalls of the channel fins; and
    forming the gate insulation layer on exposed portions of the channel fins.

5. The method of claim 4, further comprising removing the mask pattern before forming the gate insulation layer.

6. The method of claim 4, wherein forming the lower gate patterns comprises filling the openings with a conductive layer; and
    wherein forming the upper gate pattern comprises patterning the conductive layer.

7. The method of claim 6, further comprising forming a metal silicide pattern on the upper gate pattern.

8. The method of claim 1, wherein forming the gate insulation layer comprises:
    filling a lower portion of a trench in the substrate with a first field insulation pattern, the trench being formed at a surface portion of the substrate by forming the fin structure;
    forming sacrificial spacers and at least one sacrificial plug, the sacrificial spacers being formed on outer sidewalls of channel fins of the fin structure protruding from an upper face of the first field insulation pattern and outer side faces of the connection patterns, and the sacrificial plug filling at least one space between the channel fins;

filling a remaining portion of the trench with a second field insulation layer;

removing the sacrificial spacers and the at least one sacrificial plug to form an opening partially exposing sidewalls of the channel fins; and forming the gate insulation layer on exposed portions of the channel fins.

9. A method comprising:

forming a fin structure on a substrate, the fin structure protruding from the substrate and extending in a first horizontal direction, and including source/drain patterns and a channel fin connected between the source/drain patterns;

forming a gate insulation layer on the channel fin;

forming lower gate patterns on opposite sidewalls of the channel fin, the lower gate patterns extending in a vertical direction; and forming an upper gate pattern extending in a second horizontal direction and across the lower gate patterns, the upper gate pattern being connected to upper portions of the lower gate patterns, wherein at least one of the lower gate patterns is surrounded by the source/drain patterns and the channel fins without spaces between the lower gate patterns and the source/drain patterns and the channel fins.

10. A method comprising:

forming a fin structure on a substrate, the fin structure protruding from the substrate and extending in a first horizontal direction, and including source/drain patterns and channel fins connected between the source/drain patterns;

forming a gate insulation layer on the channel fins;

forming lower gate patterns to contact the gate insulation layer and extending in a vertical direction substantially perpendicular to the substrate such that at least one of the lower gate patterns is surrounded in all horizontal directions by the gate insulation layer without spaces between the lower gate patterns and the gate insulation layer; and forming an upper gate pattern extending in a second horizontal direction that is substantially perpendicular to the first horizontal direction, the upper gate pattern being connected to upper portions of the lower gate patterns.

* * * * *